(12) United States Patent
Atanackovic

(10) Patent No.: US 8,106,381 B2
(45) Date of Patent: Jan. 31, 2012

(54) SEMICONDUCTOR STRUCTURES WITH RARE-EARTHS

(75) Inventor: Petar B. Atanackovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 494 days.

(21) Appl. No.: 11/873,387

(22) Filed: Oct. 16, 2007

(65) Prior Publication Data

US 2009/0236595 A1 Sep. 24, 2009

Related U.S. Application Data

(60) Provisional application No. 60/852,445, filed on Oct. 18, 2006.

(51) Int. Cl.
*H01L 29/06* (2006.01)
*H01L 31/00* (2006.01)
*H01L 27/12* (2006.01)
*H01L 21/02* (2006.01)

(52) U.S. Cl. ............ 257/22; 257/18; 257/347; 257/613; 257/614; 257/615

(58) Field of Classification Search .................... 257/43, 257/613–615, E29.296, E31.04–E31.042, 257/18, 347
See application file for complete search history.

(56) References Cited

U.S. PATENT DOCUMENTS

| | | | |
|---|---|---|---|
| 6,734,453 B2 | 5/2004 | Atanackovic | |
| 6,852,575 B2 * | 2/2005 | Bojarczuk et al. ............ 438/149 | |
| 6,858,864 B2 | 2/2005 | Atanackovic | |
| 6,943,385 B2 | 9/2005 | Usuda | |
| 7,018,484 B1 | 3/2006 | Atanackovic | |
| 7,023,011 B2 | 4/2006 | Atanackovic | |
| 7,037,806 B1 | 5/2006 | Atanackovic | |
| 7,129,551 B2 | 10/2006 | Osten | |
| 7,135,699 B1 | 11/2006 | Atanackovic | |
| 7,199,015 B2 | 4/2007 | Atanackovic | |
| 7,199,451 B2 | 4/2007 | Kelman | |
| 7,211,821 B2 | 5/2007 | Atanackovic | |
| 7,217,636 B1 | 5/2007 | Atanackovic | |
| 7,253,080 B1 | 8/2007 | Atanackovic | |
| 7,273,657 B2 | 9/2007 | Atanackovic | |
| 7,351,993 B2 | 4/2008 | Atanackovic | |
| 7,384,481 B2 | 6/2008 | Atanackovic | |
| 7,416,959 B2 | 8/2008 | Atanakovic | |
| 7,432,550 B2 | 10/2008 | Bojarczuk, Jr. et al. | |
| 7,432,569 B1 * | 10/2008 | Atanackovic ................. | 257/410 |
| 7,476,600 B1 * | 1/2009 | Atanackovic ................. | 438/479 |
| 7,498,229 B1 * | 3/2009 | Atanackovic ................. | 438/311 |
| 7,645,517 B2 | 1/2010 | Atanackovic | |
| 7,655,327 B2 | 2/2010 | Atanackovic | |
| 7,709,826 B2 | 5/2010 | Atanackovic | |
| 7,902,546 B2 | 3/2011 | Atanackovic | |
| 7,928,317 B2 | 4/2011 | Atanackovic | |
| 2003/0057491 A1 * | 3/2003 | Mitani et al. ................... | 257/347 |
| 2003/0136331 A1 * | 7/2003 | Ami et al. .......................... | 117/2 |
| 2004/0011280 A1 * | 1/2004 | Higuchi et al. .................. | 117/97 |
| 2005/0163692 A1 * | 7/2005 | Atanackovic ................. | 423/263 |
| 2006/0037529 A1 | 2/2006 | D'Evelyn | |
| 2006/0060826 A1 * | 3/2006 | Atanackovic ................. | 252/500 |
| 2006/0145186 A1 * | 7/2006 | Wallis ........................... | 257/190 |

(Continued)

*Primary Examiner* — Zandra Smith
*Assistant Examiner* — Jeremy Joy
(74) *Attorney, Agent, or Firm* — Fernandez & Associates, LLP

(57) ABSTRACT

The present invention discloses structures to increase carrier mobility using engineered substrate technologies for a solid state device. Structures employing rare-earth compounds enable heteroepitaxy of different semiconductor materials of different orientations.

5 Claims, 32 Drawing Sheets

U.S. PATENT DOCUMENTS

| | | |
|---|---|---|
| 2007/0020891 A1 | 1/2007 | Kouvetakis |
| 2007/0048919 A1* | 3/2007 | Adetutu et al. ............... 438/199 |
| 2008/0187768 A1 | 8/2008 | Kouvetakis |
| 2008/0223438 A1 | 9/2008 | Xiang |
| 2008/0241519 A1 | 10/2008 | Schroeder |
| 2008/0277647 A1 | 11/2008 | Kouvetakis |
| 2009/0183774 A1 | 7/2009 | Atanackovic |
| 2009/0227440 A1 | 9/2009 | Weber |
| 2009/0229661 A1 | 9/2009 | Mortenson |
| 2009/0236595 A1 | 9/2009 | Atanackovic |
| 2009/0242019 A1 | 10/2009 | Ramamoorthy |
| 2010/0032687 A1 | 2/2010 | Calder |

* cited by examiner

Figure 1: Possible MOSFET device architectures to be used in present and future technology nodes.
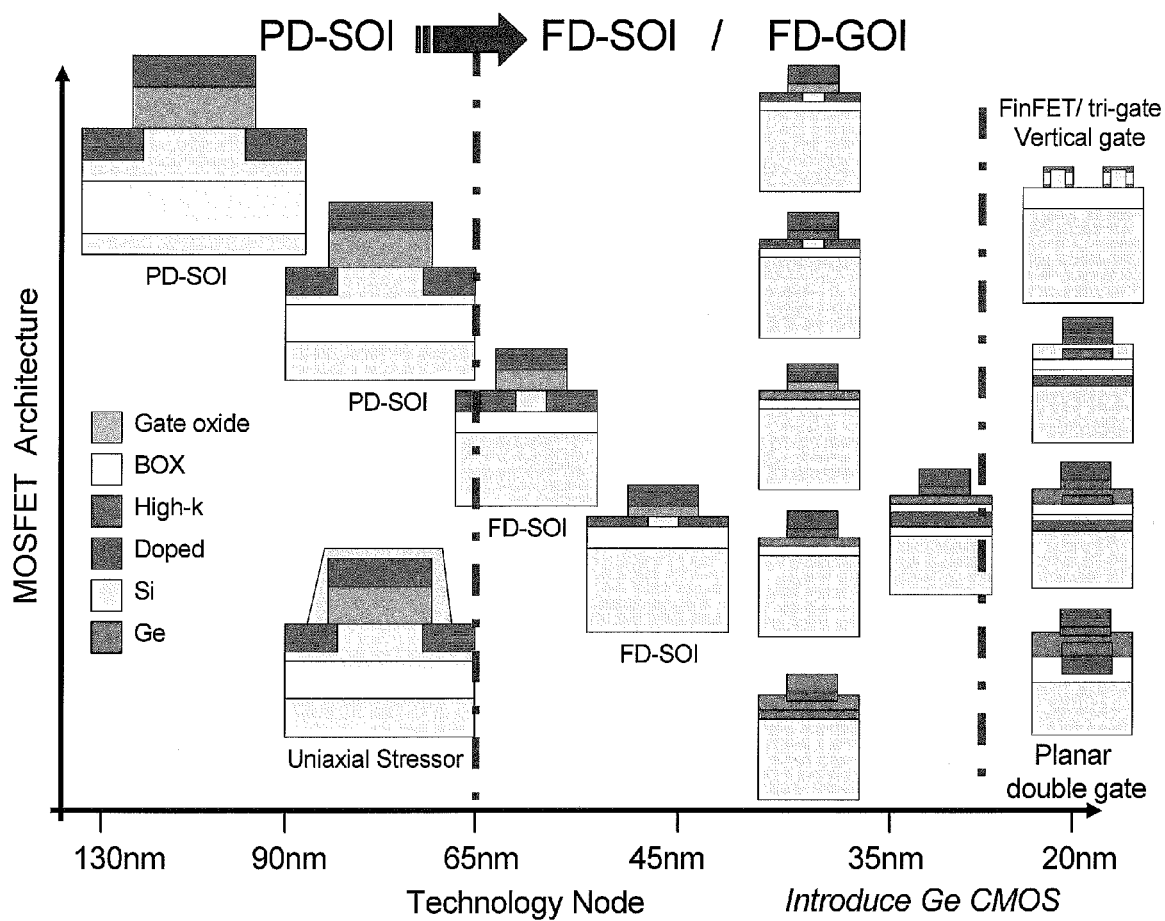

Figure 2: Electron $\mu_e$ and hole $\mu_h$ mobility for Si(100) surface orientation as function of carrier density ($N_{inv}$).
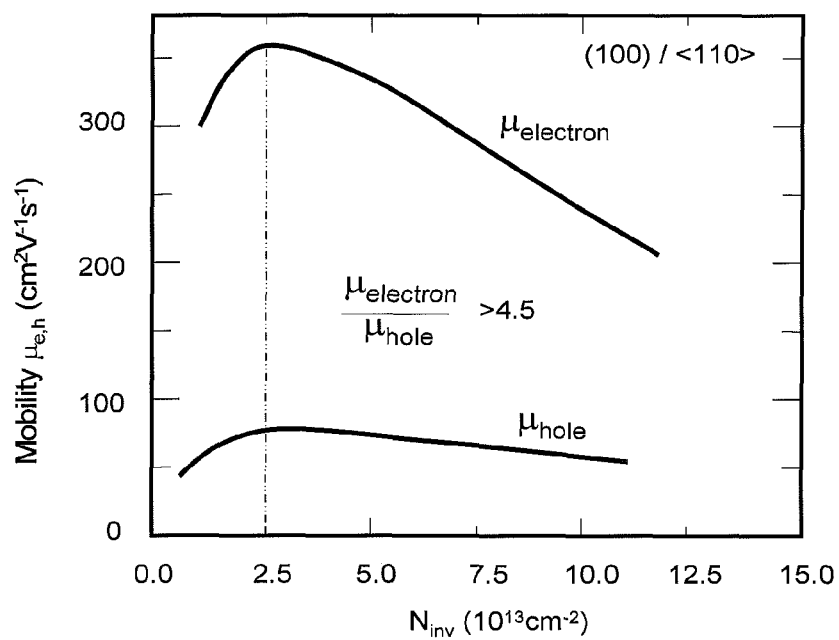

Figure 3a, b, c, d: (a) (100) surface with <011> channel; (b) (110) surface with <110> channel; (c)Electron and (d) hole mobilityfor (100), (110) and (111) surface orientations .
(3a)
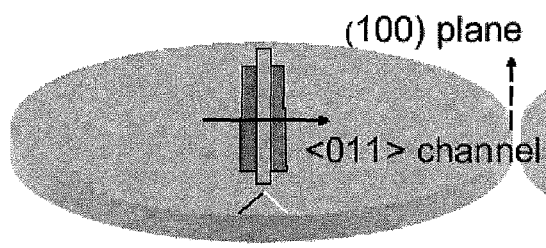
(3b)
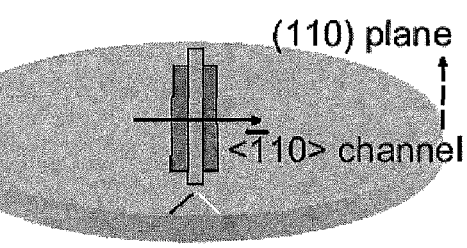
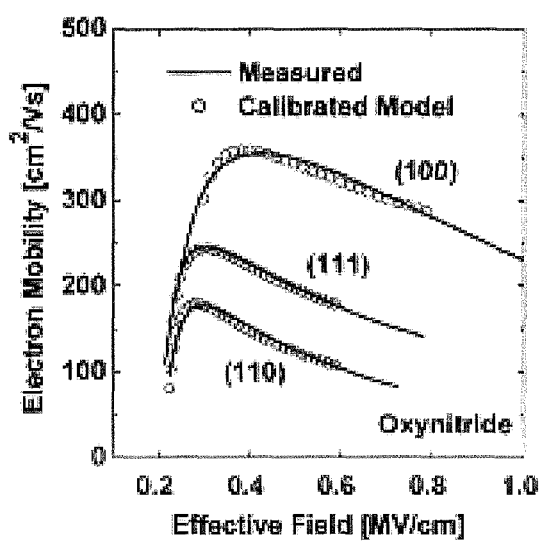
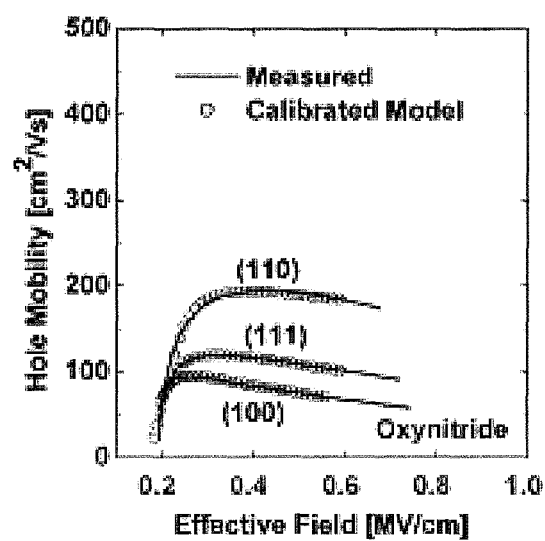
(3c)
(3d)

Figure 4: Intra-planar orientation dependence of MOSFET's fabricated on a (100) substrate surface with channel oriented at 0°/ ±45°/ ±90°; D, drain, S, source, and G, gate are shown.
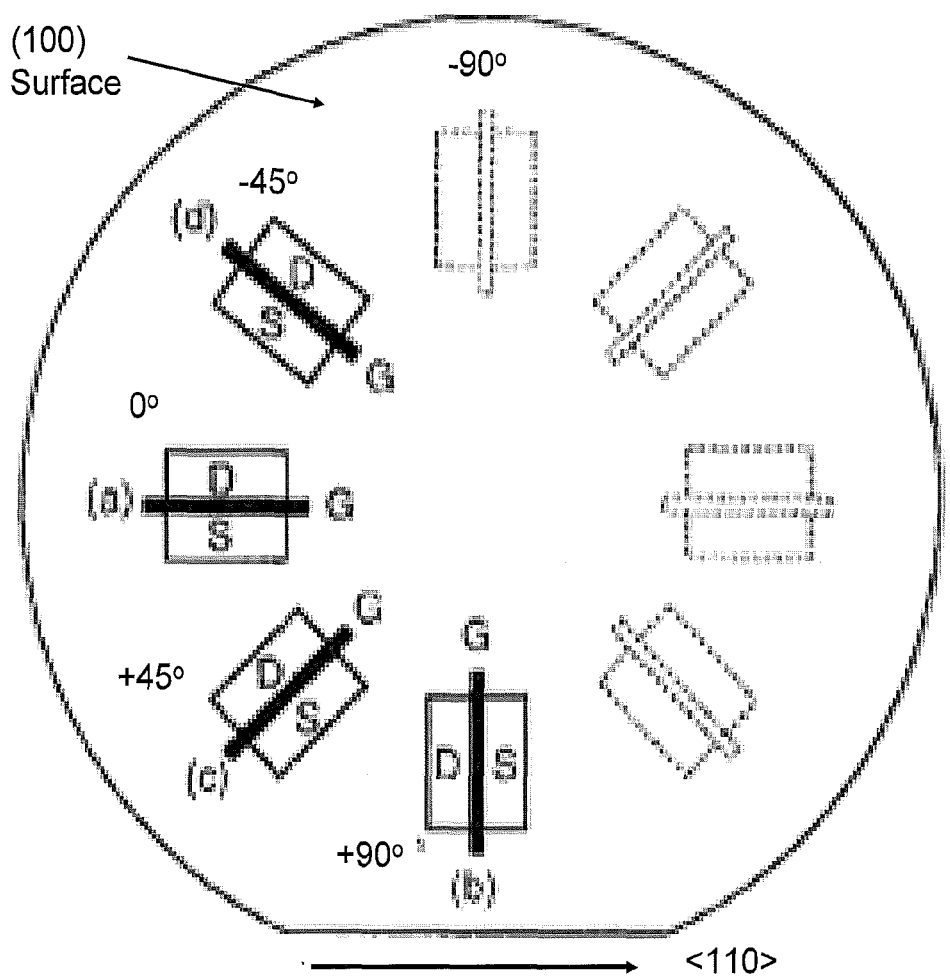

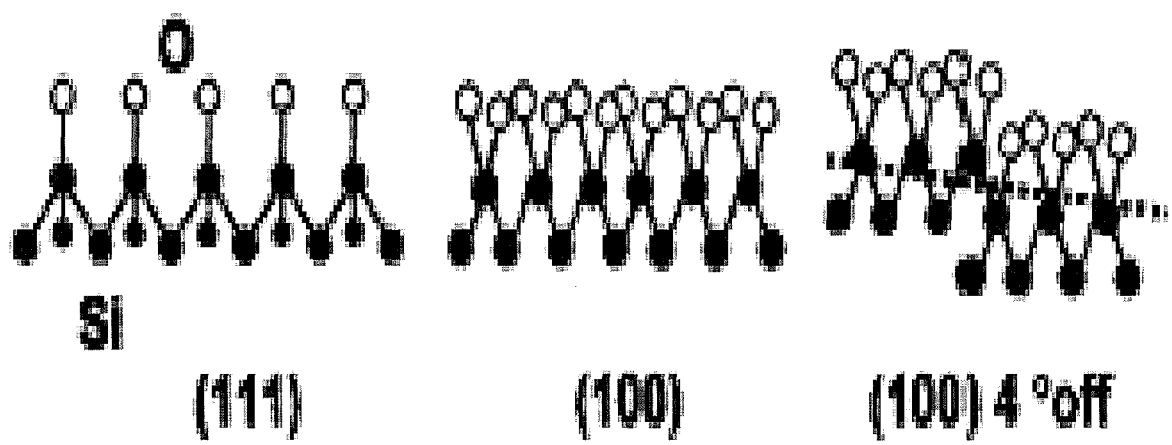
Figure 5a, b, c: Oxidation of (a) (111), (b) (100) and (c) (100) 4° off-cut bulk Si surface.

Figure 6a and b: nMOS/ electron (a-lower) and pMOS/ hole mobility (b-upper) for various silicon substrate orientations for Si-oxynitride (dashed curves) and $HfO_2$ (solid) gate dielectric as a function of channel inversion charge density.
(a)
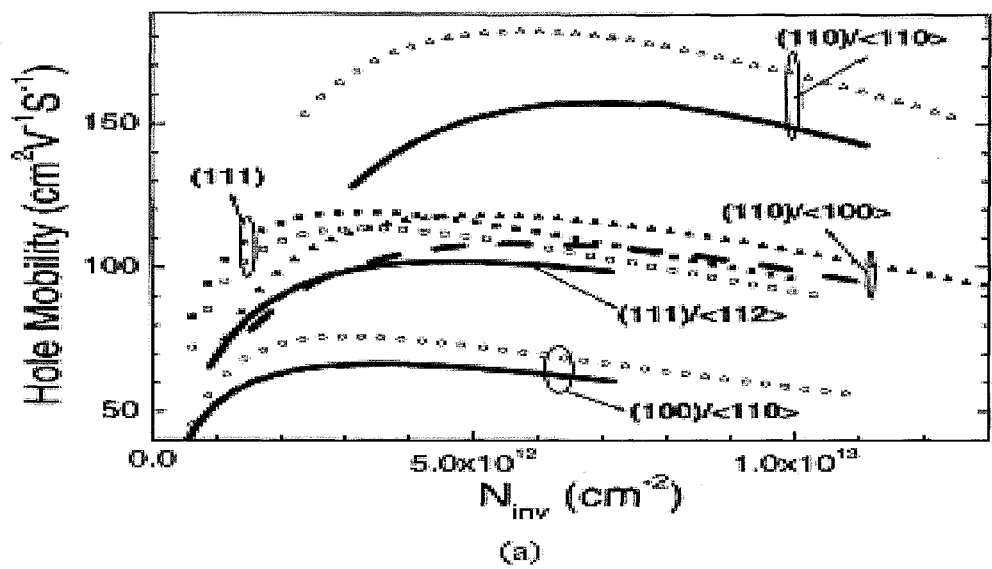
(b)
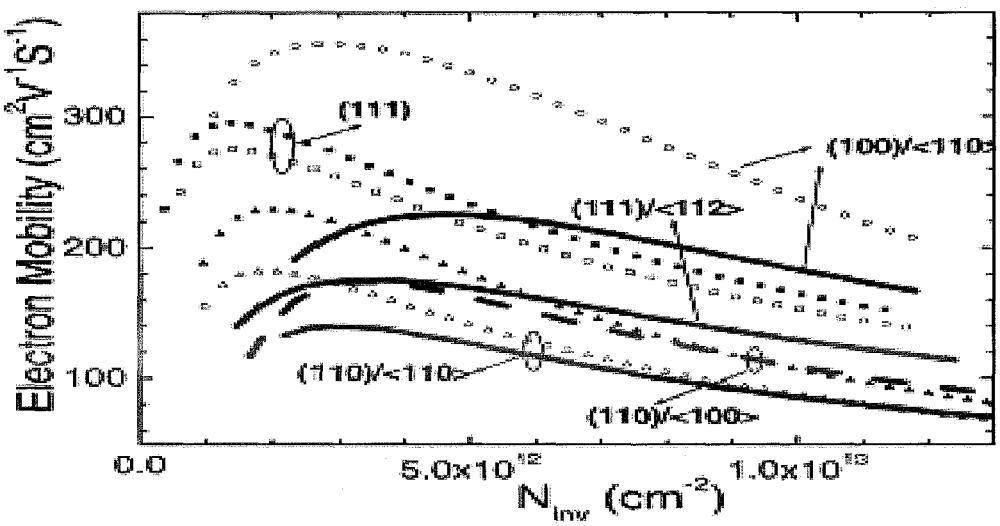

Fig 7: (a) TEM of direct-silicon-bonding, DSB, of 50nm Si (110) & Si(100); (b) TEM of Si implant and (c) SPE re-orientation to Si(100).
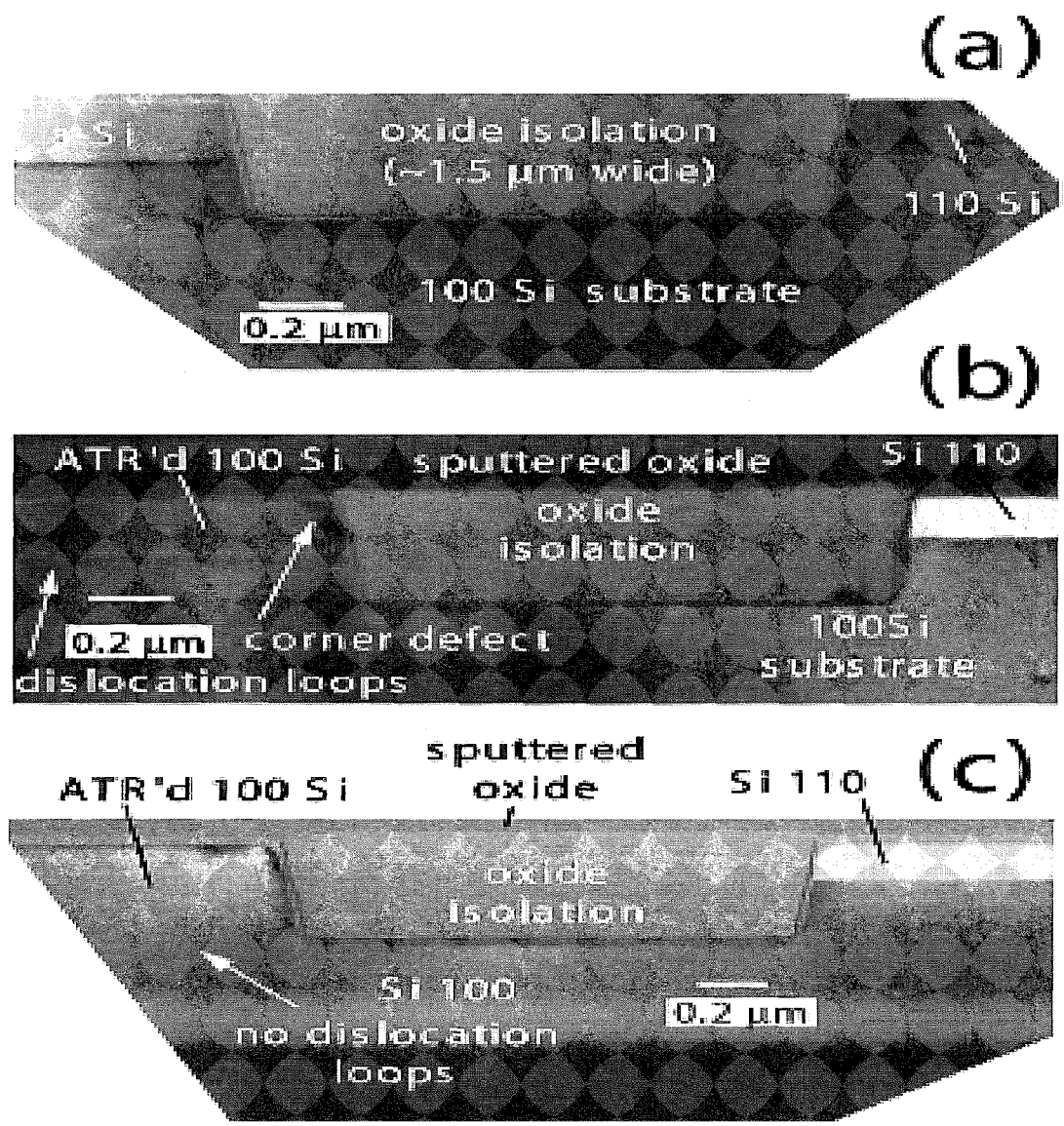

Fig 8 a and b: Direct silicon bonding of hybrid orientation(a) and implant /anneal process (b) used for Si(jkl)→Si(j'k'l').
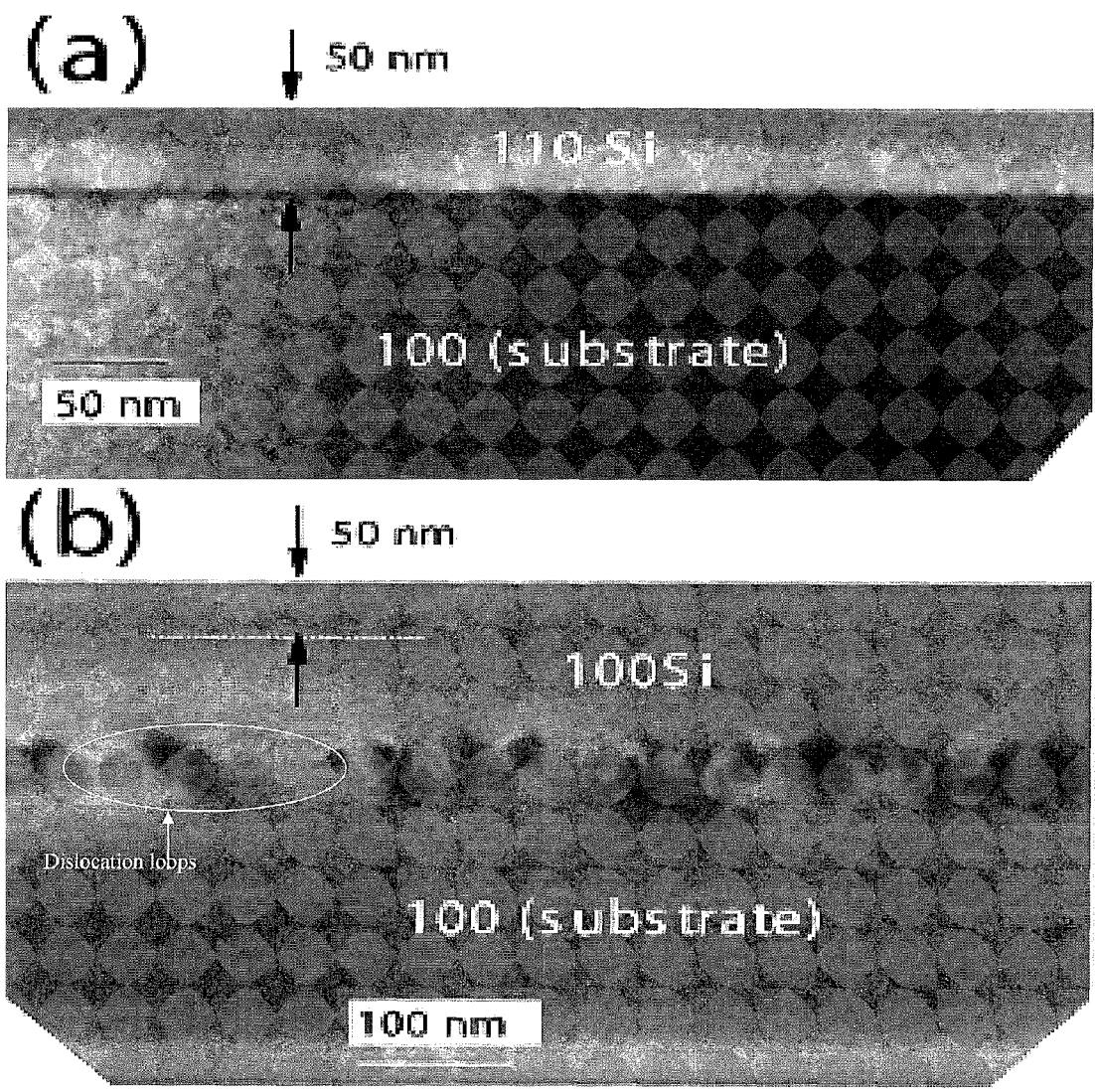

Figure 9
epi-Twist Technology
ErOx on Si(001) → ErOx(110)
Si on Er(110) → Si(110)
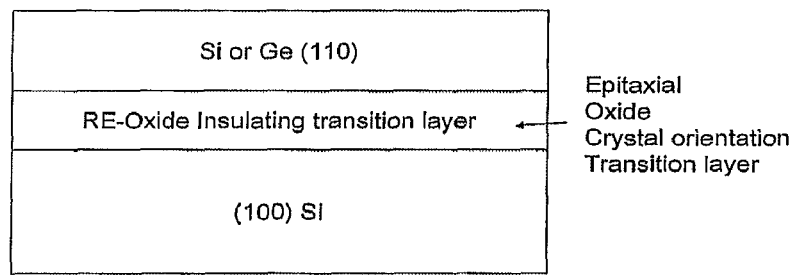
Epitaxial Oxide Crystal orientation Transition layer
Figure 10 a and b
(a) Si (100) unit cell    (b) RE-oxide (110) unit cell
Flourite /Cubic surface reconstruction matching
Top View Silicon (001) with Si-O bond ?    Top View Flourite RE-Oxide (110)A
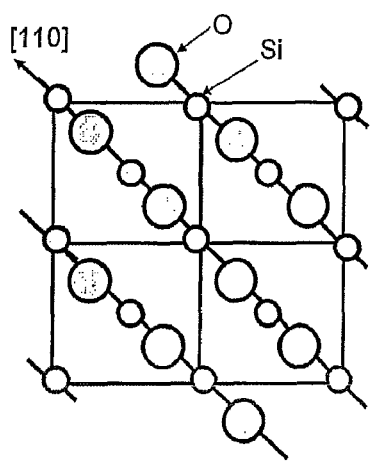 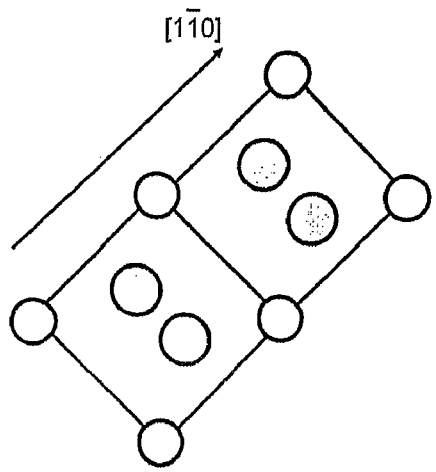

Figure 11 Oxygen mediated template epitaxy of tetragonal REOx on Si(100) surface. RE-oxide unit cell overlayed with Si unit cell showing two alternative alignments 1105 and 1107.
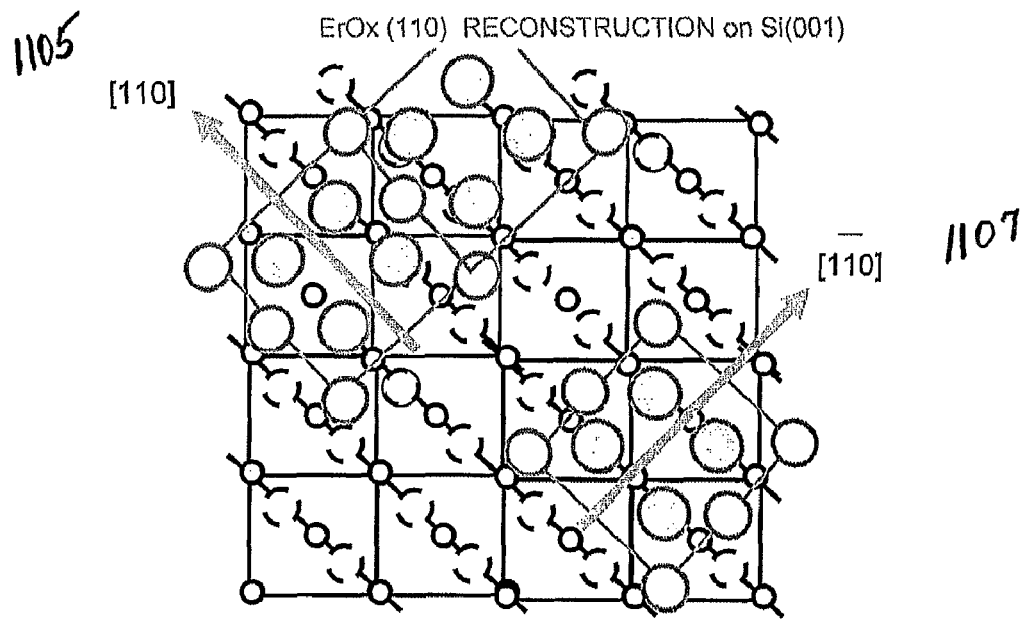

Figure 12a and b: Epi-twist technology used to epitaxially deposit a Si(110) or Ge(110) active layer via a tetragonal REOx on a Si(100) substrate.
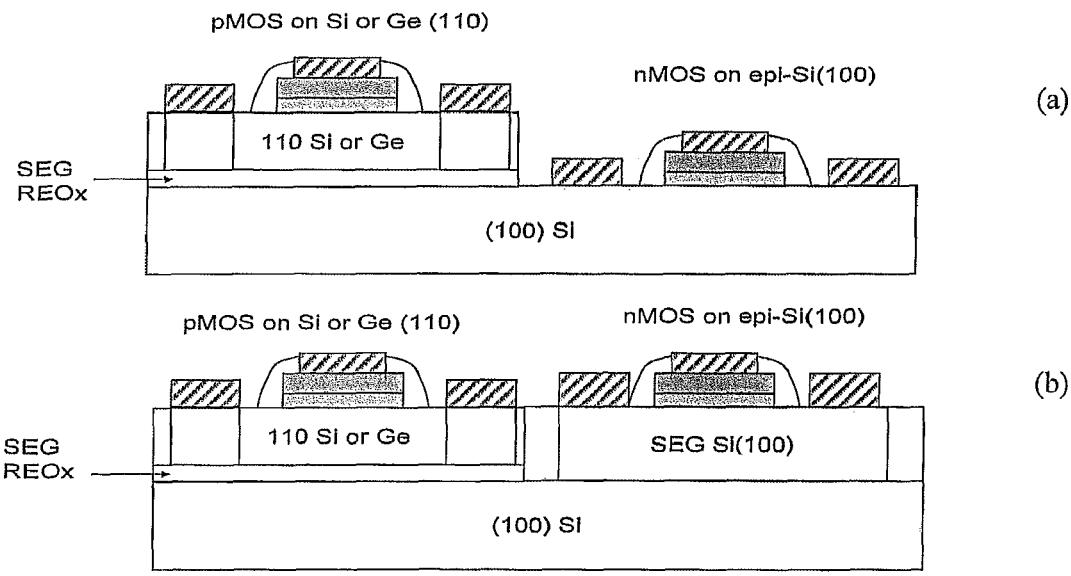
Figure 13 Epi-twist process steps used to fabricate selective area epitaxy of pMOS(110) and nMOS(100).
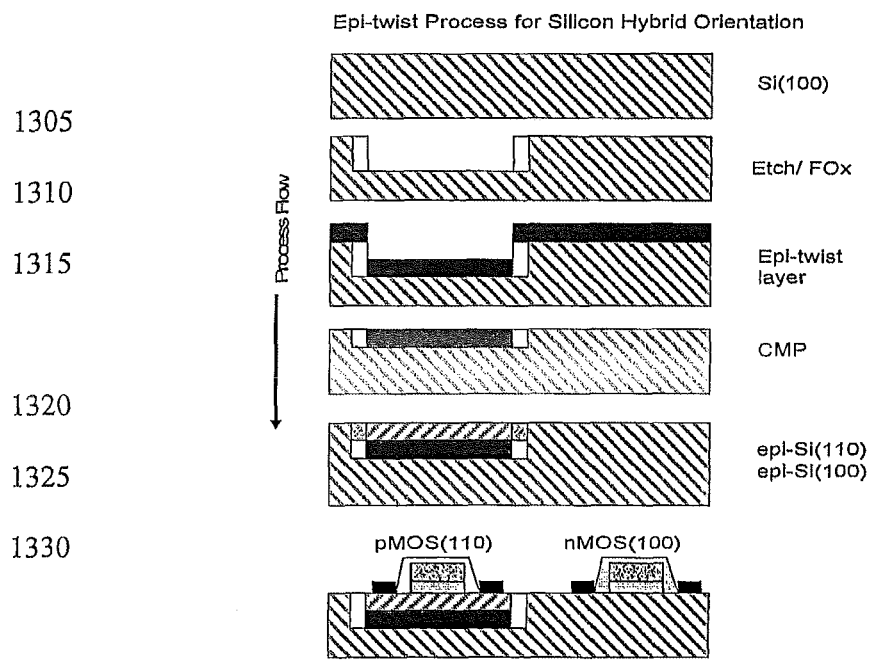

Figure 14: Gate oxide scaling showing monolayer thickness of SiOxyNitride required at the 65nm node.
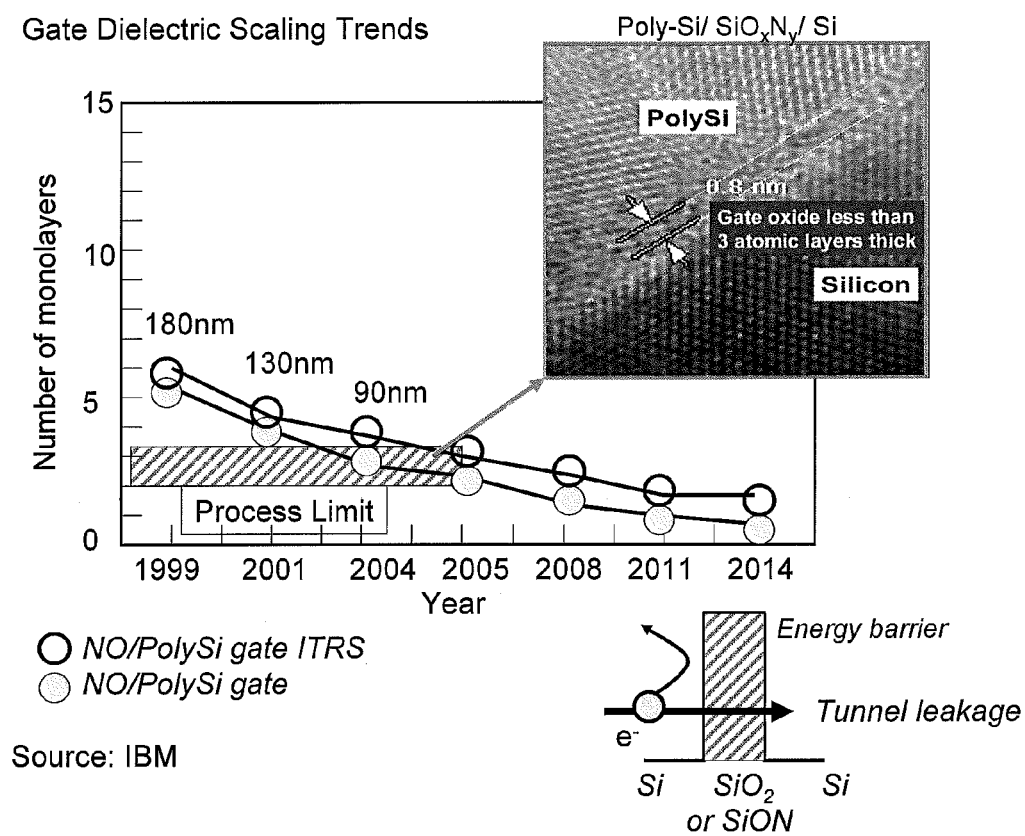

Figure 15: Classical fully depleted, FD-SOI silicon layer thickness scaling $t_{Si}=L_g/3$, versus gate length.
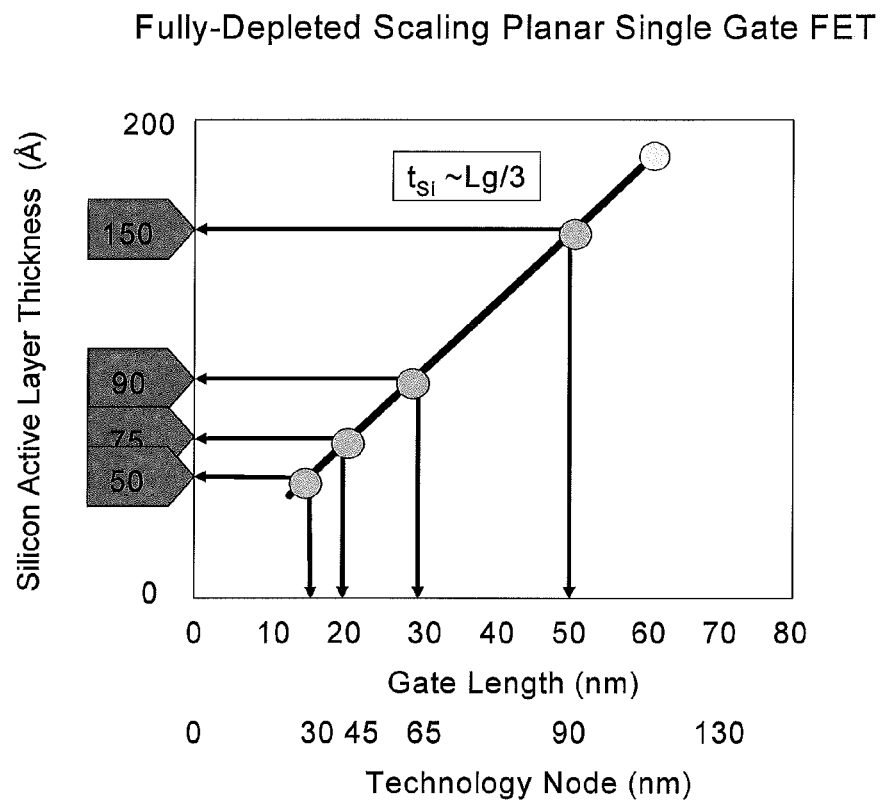

Figure 16a, b, c, d: Key steps in a Silicon-on-Nothing (SON) process for single gate MOSFET.
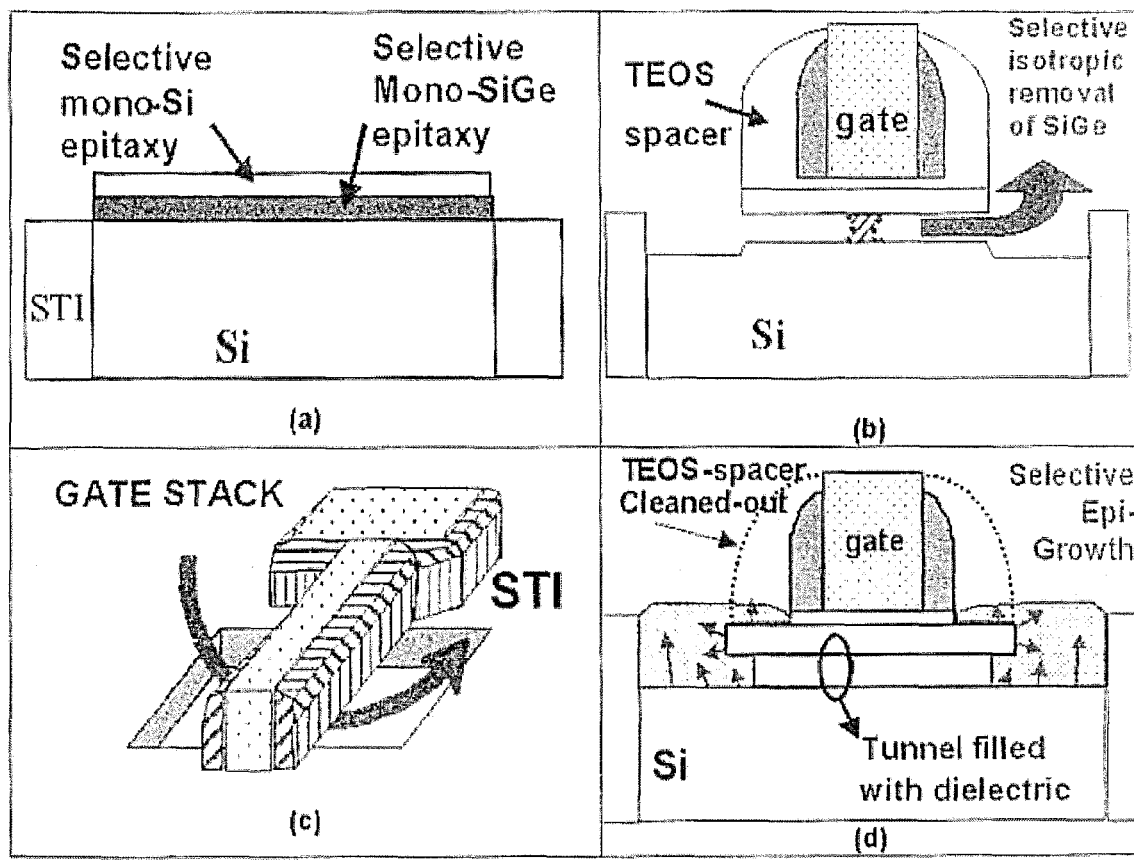

Figure 17a and b: (a) Examplary structure of Silicon-on-Nothing, SON, single gate planar MOSFET with localized BOX and ground plane. Insert (b) shows TEM of 9nm Si channel and upper 2nm SiO$_2$ gate oxide and poly-Si gate stack.
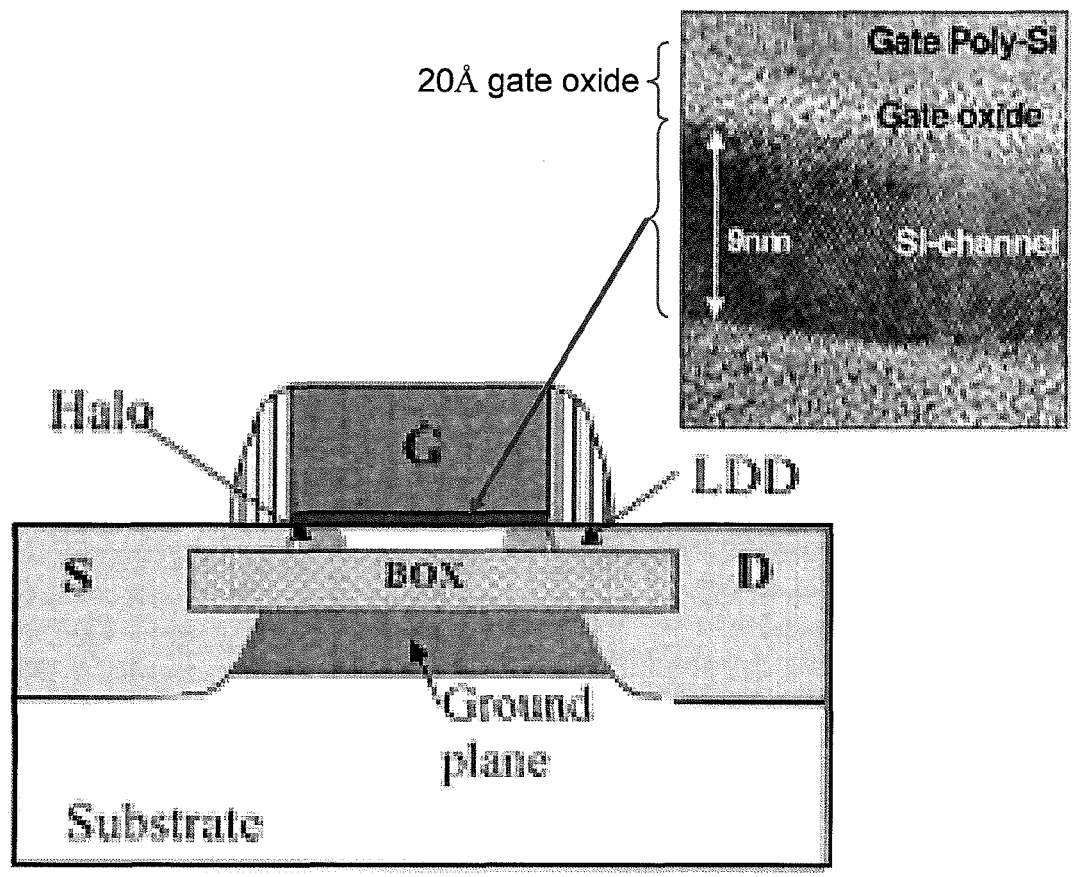

Figure 18: Silicon-on-Nothing, SON, $L_g$= 80nm MOSFET with the "nothing" layer = 20nm $SiO_2$ localized BOX beneath the UTB 20nm Si channel. A 3nm (30Å) gate oxide and poly-Si gate electrode are shown.
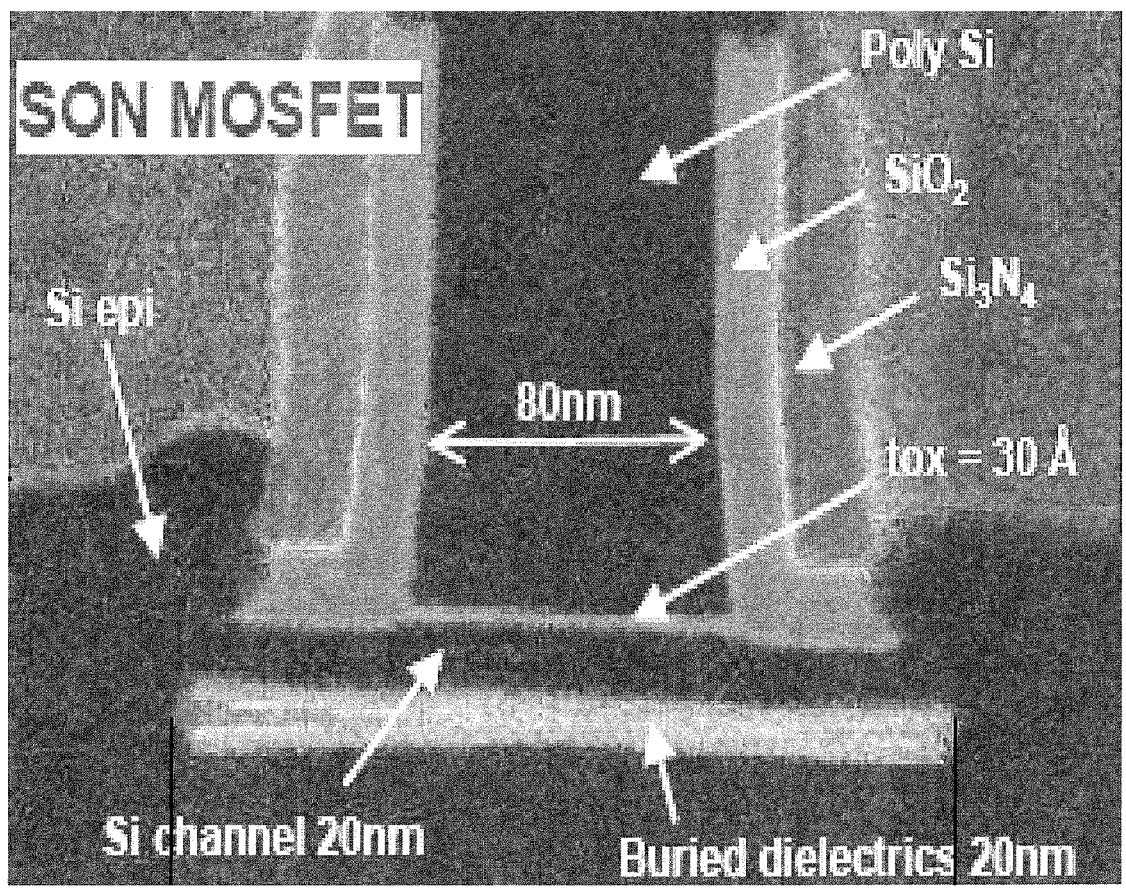

Figure 19a
Figure 19b
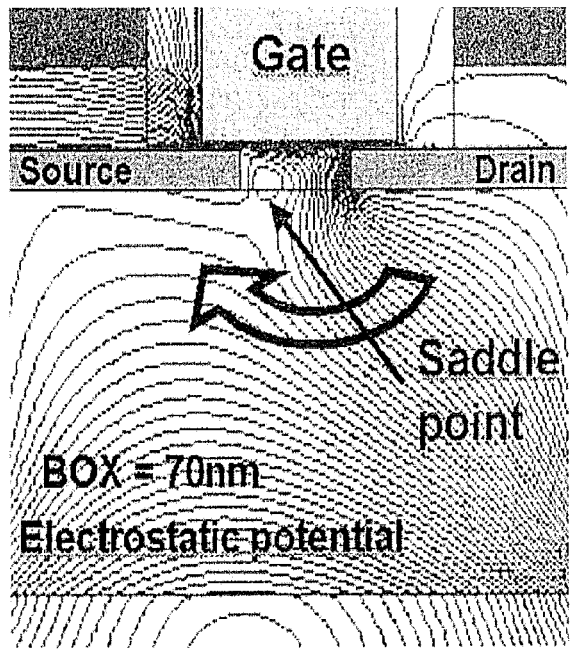
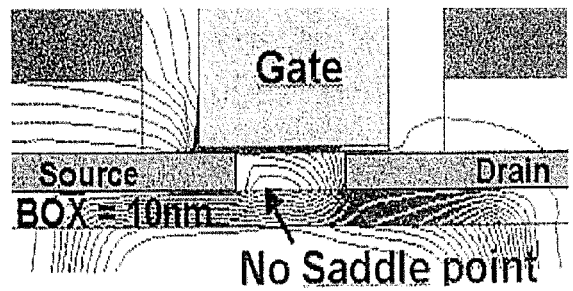

Figure 20: Predictions of electrostatic integrity (EI) and required $t_{Si}$ for planar single gate (SG)-SOI and double gate (DG)-SOI.
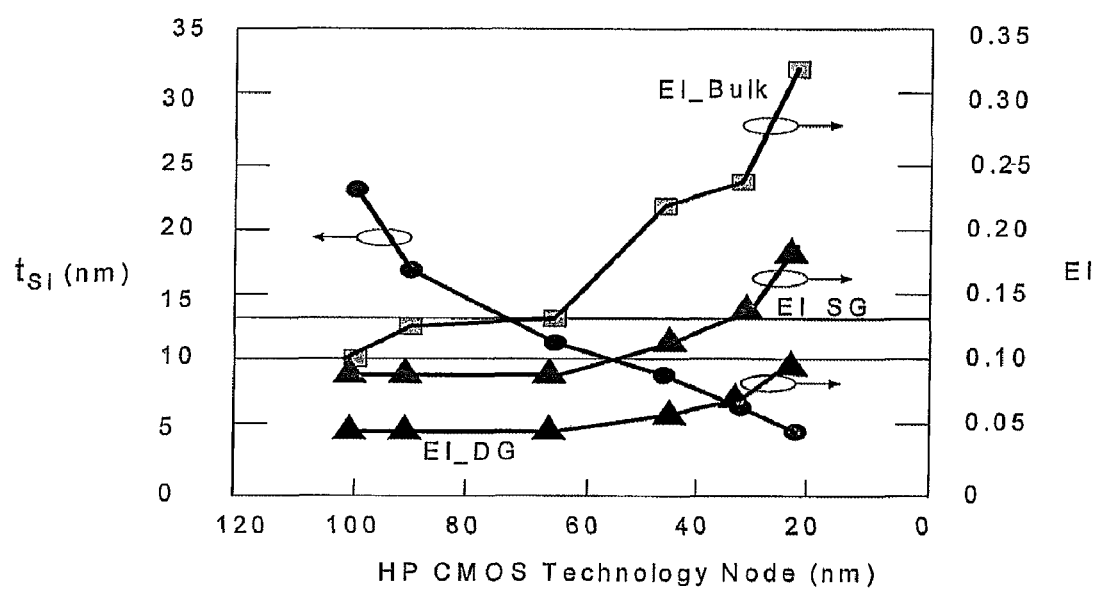

Figure 21 a and b: Silicon conduction and valence band energy-momentum dispersion of diamond crystal symmetry unstrained (a); (b) with Biaxial tensile strain.
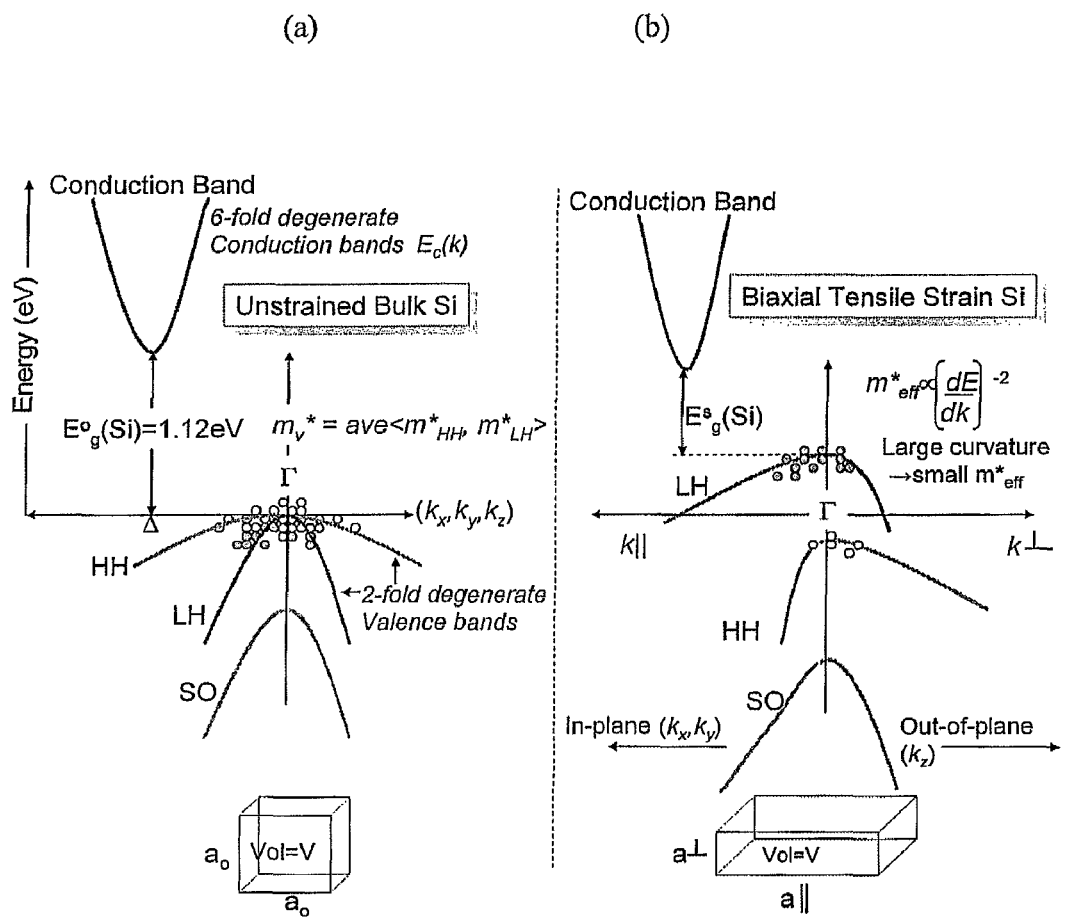

Figure 22: Bulk and biaxial tensile strained Si MOSFET showing effect on lowest lying conduction band energy ellipsoid distributions
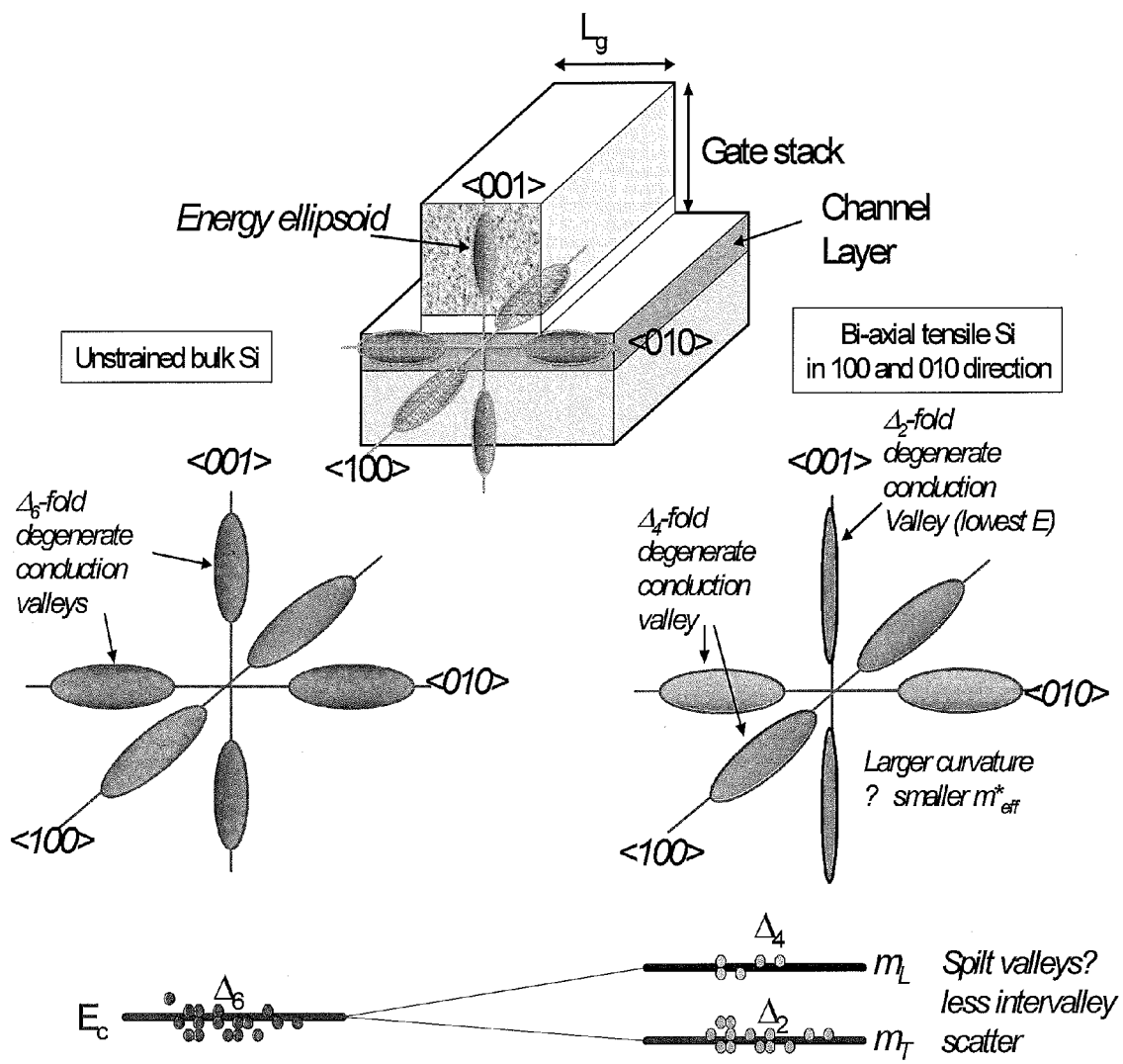

Figures 23a, b, c
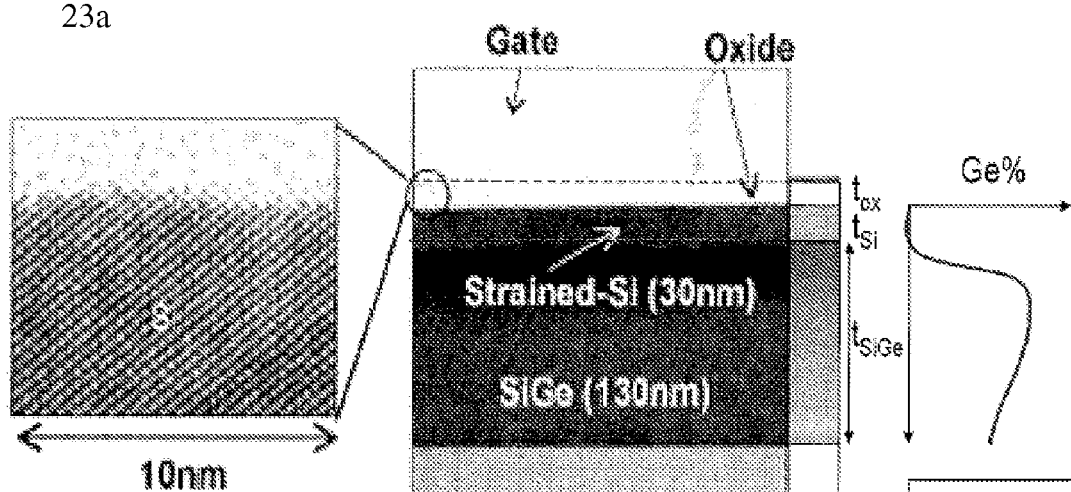
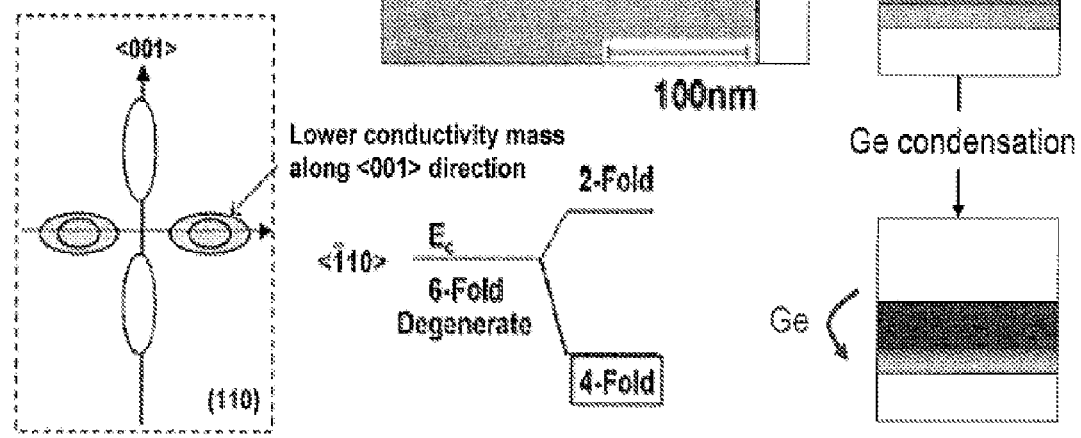

Figure 24: Schematic of ideal SiO₂/Si heterojunction with atomically abrupt interface.
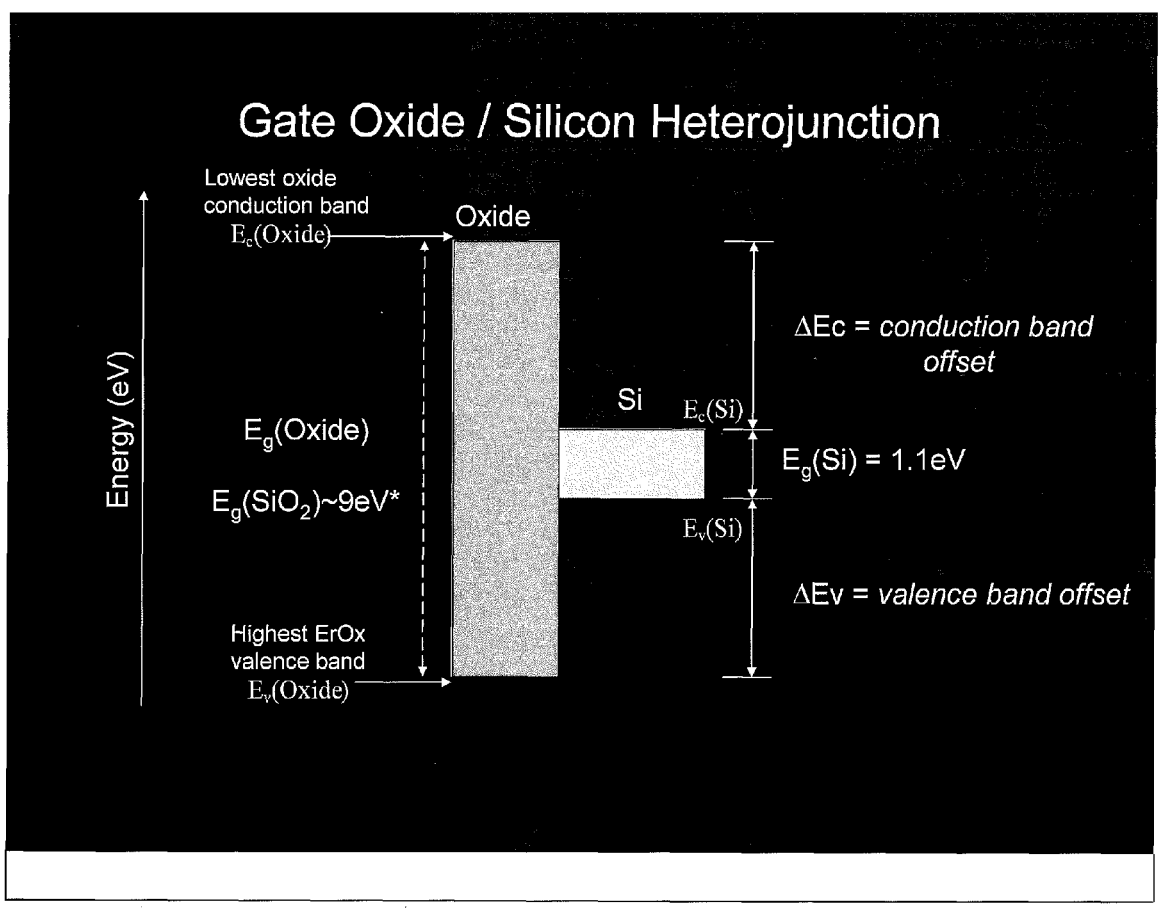

Figure 25: Single quantum well (QW) composed of wide band gap insulator barrier layer sandwiching an ultrathin narrow band gap Si or Ge layer.
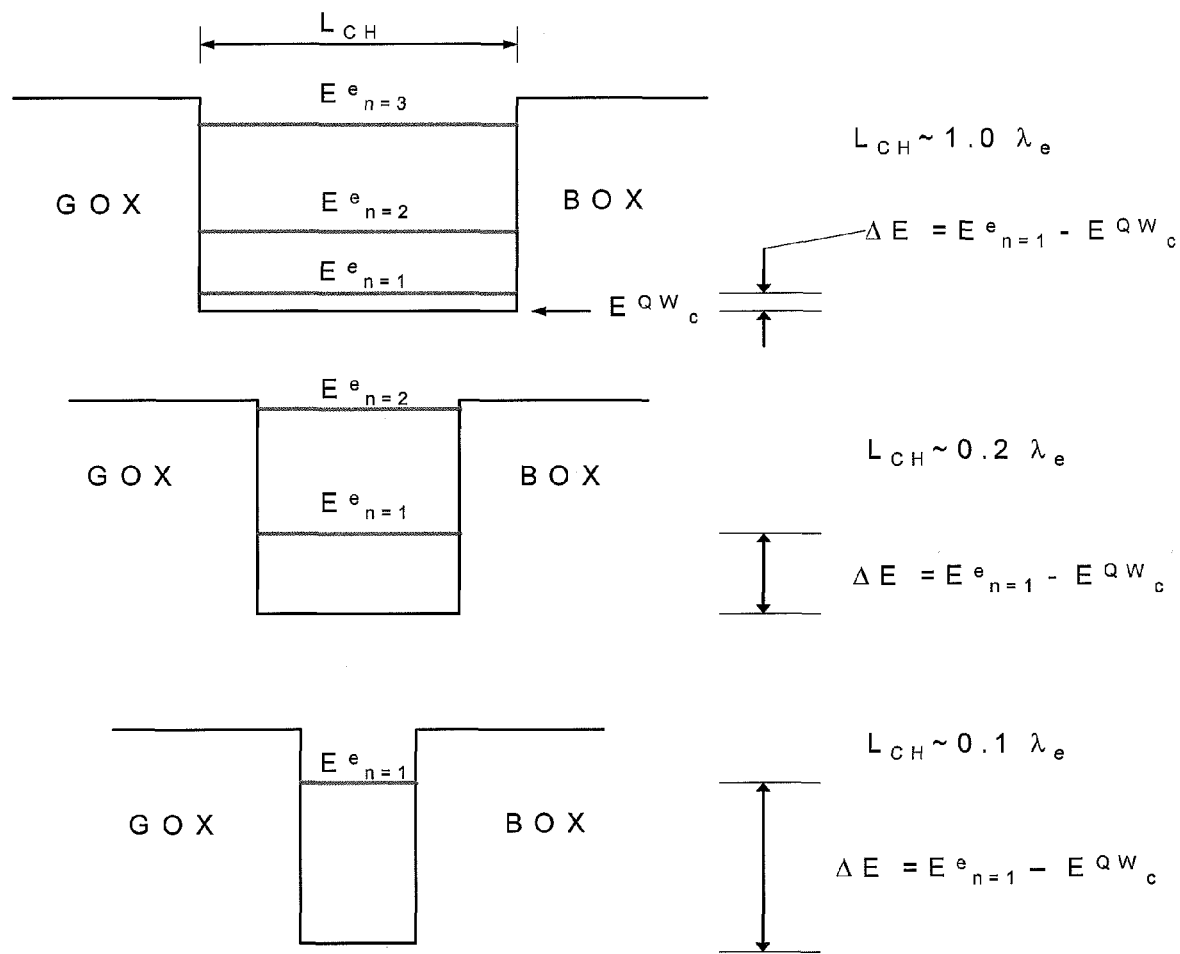

Figure 26 HRTEM and RHEED of epi-SOI featuring 18nm Si active layer and 6nm BOX.
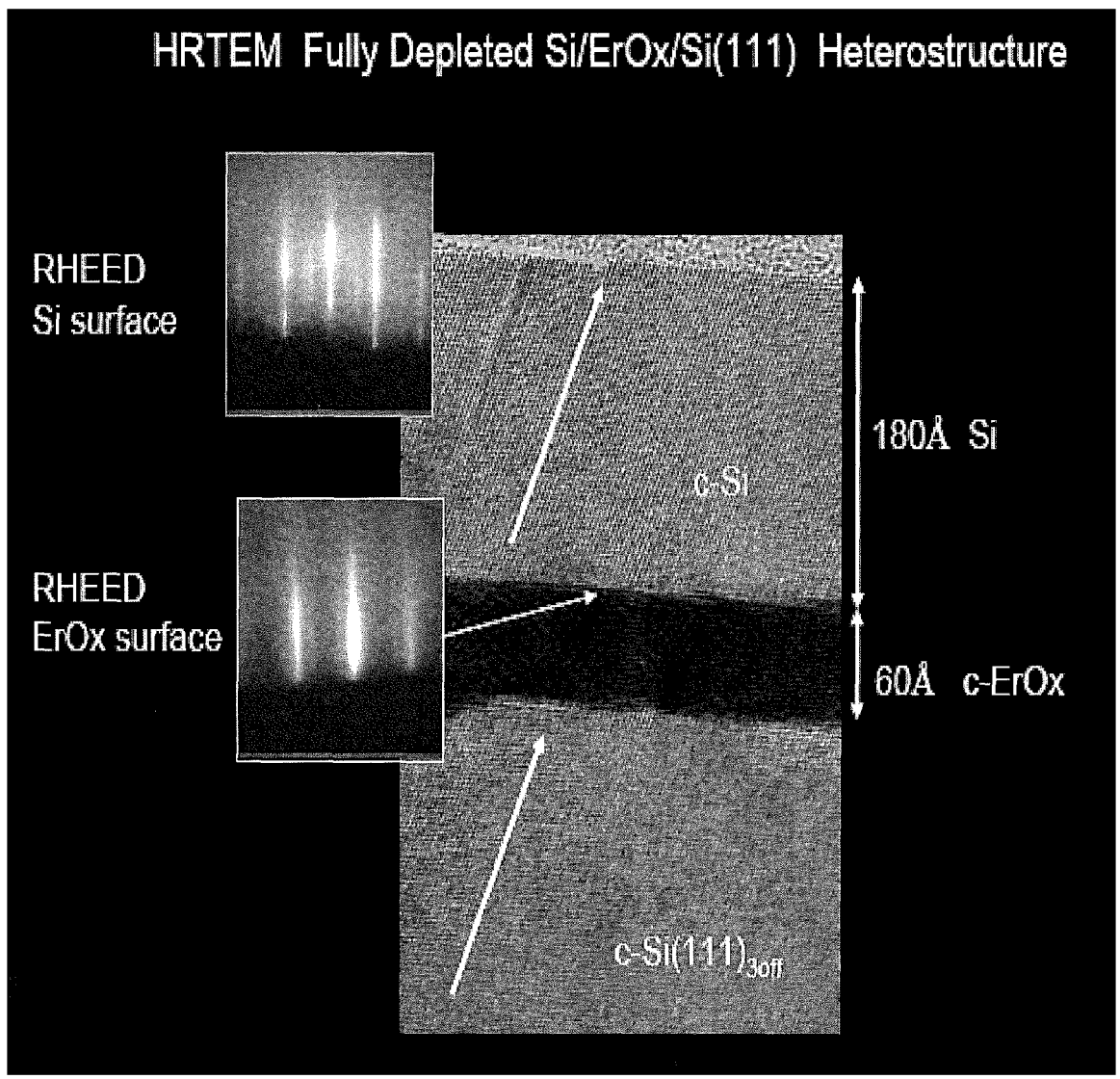

Figure 27 Single crystal three layer structure; rare-earth oxide deposited on Si(100) or Si(111) surface showing achievement of single crystal silicon on single crystal RE-oxide.
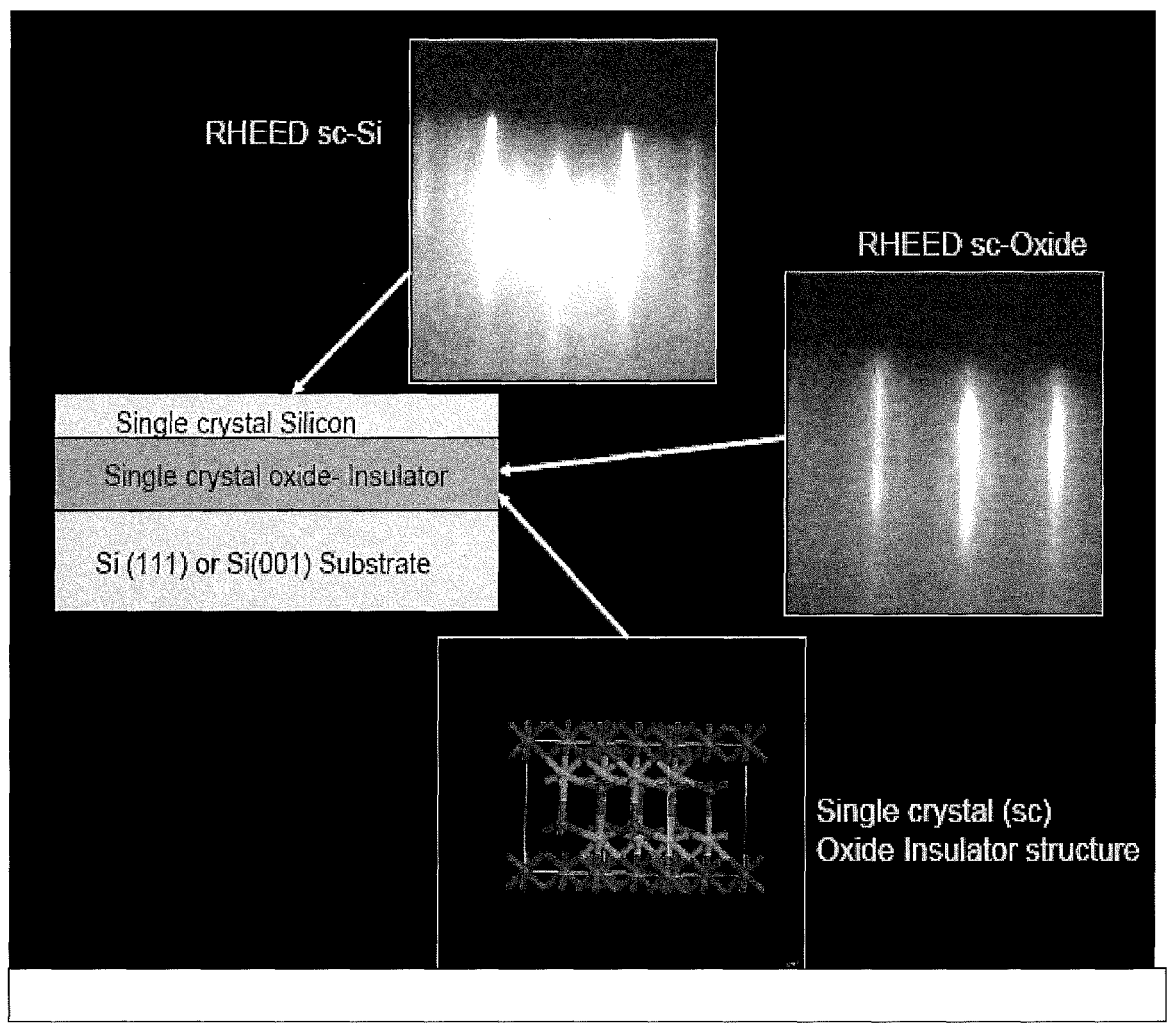

Figure28: Four layer structure with single crystal silicon interlaced with single crystal rare-earth oxide.
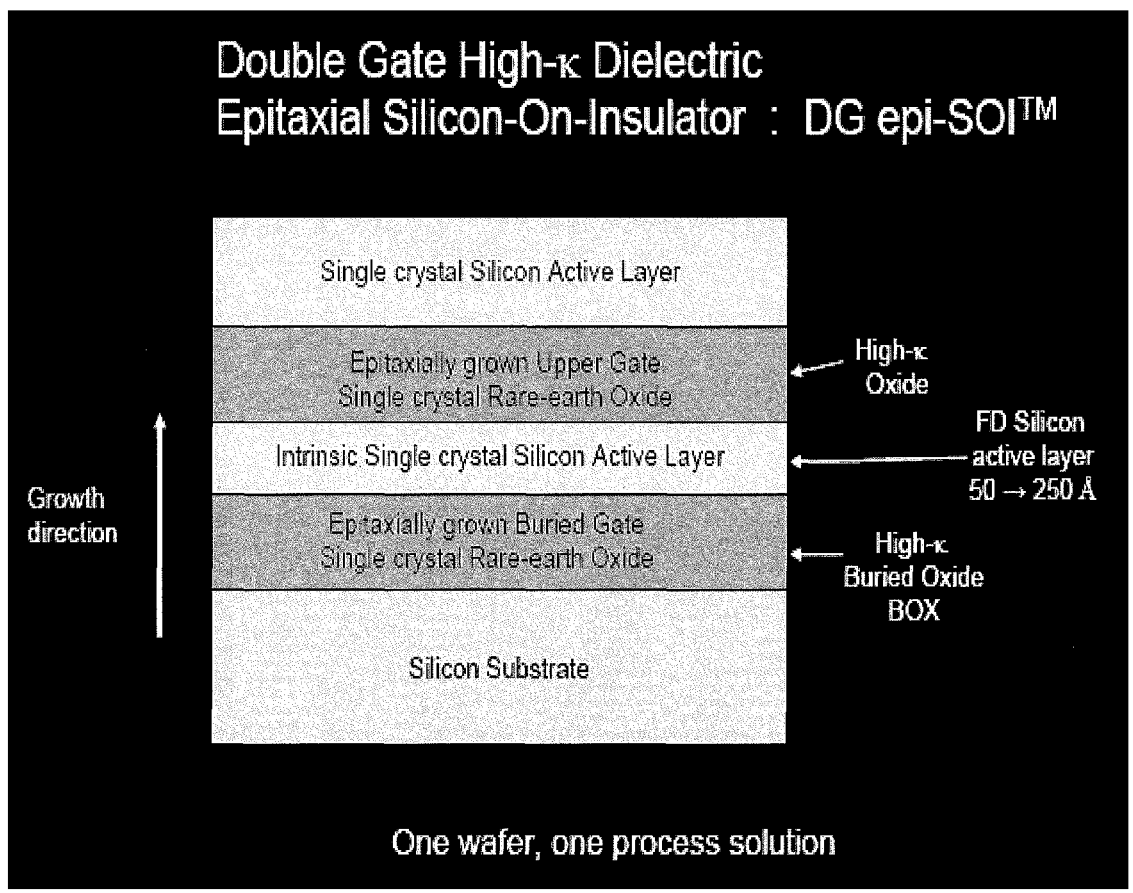

Figure 29 a, b and c: Alternative oxygen concentration schemes with rare-earth oxide intermediate layer.
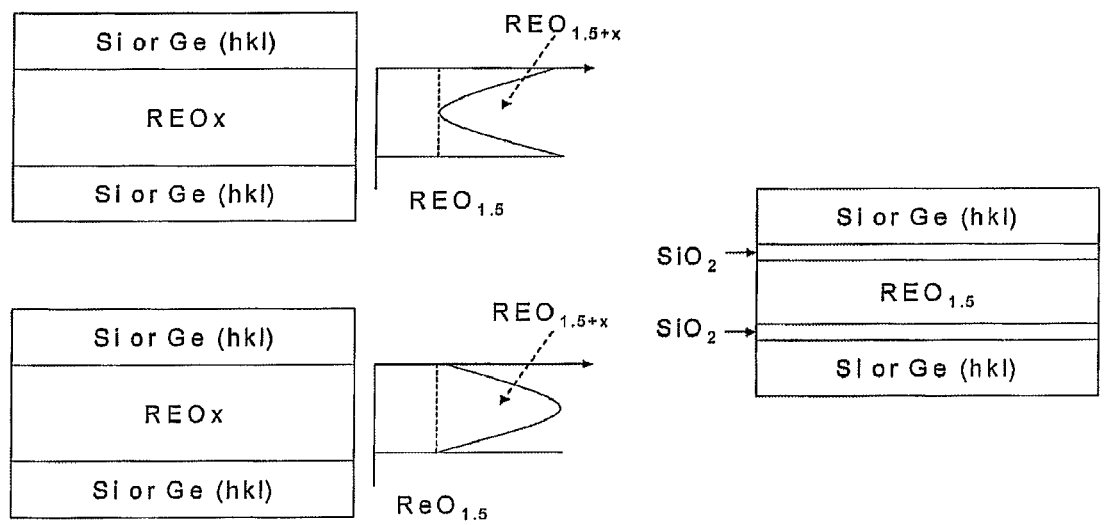

Figure 30 a and b: HRTEM of single crystal rare-earth oxynitride insulator deposited directly on (a) Si(100)  (b) Ge(100) surfaces.
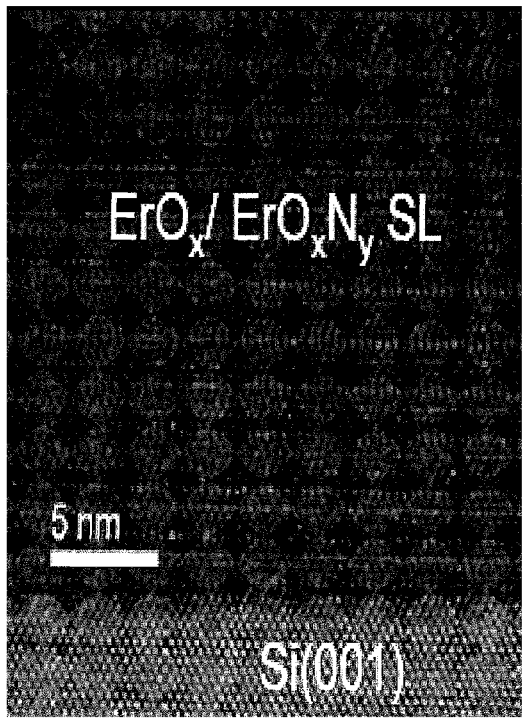
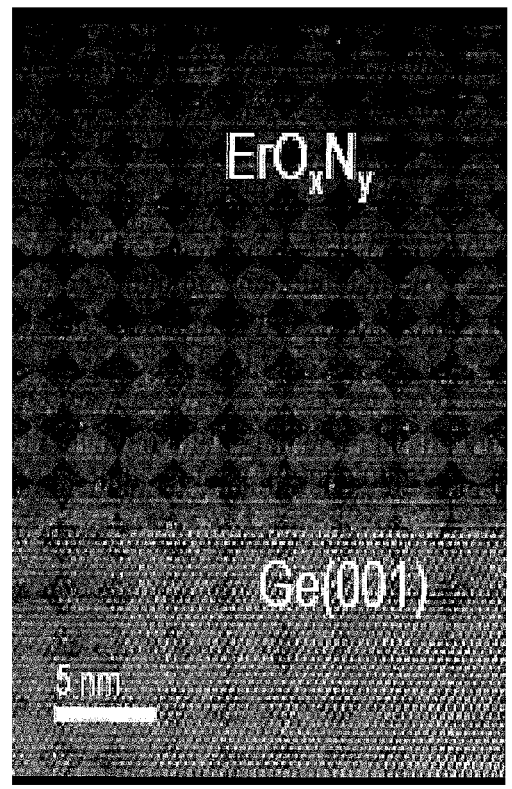

Figure 31: Novel gate stack structure for Si nMOS and pMOS devices using single crystal gate oxide and single crystal Si gate electrode.
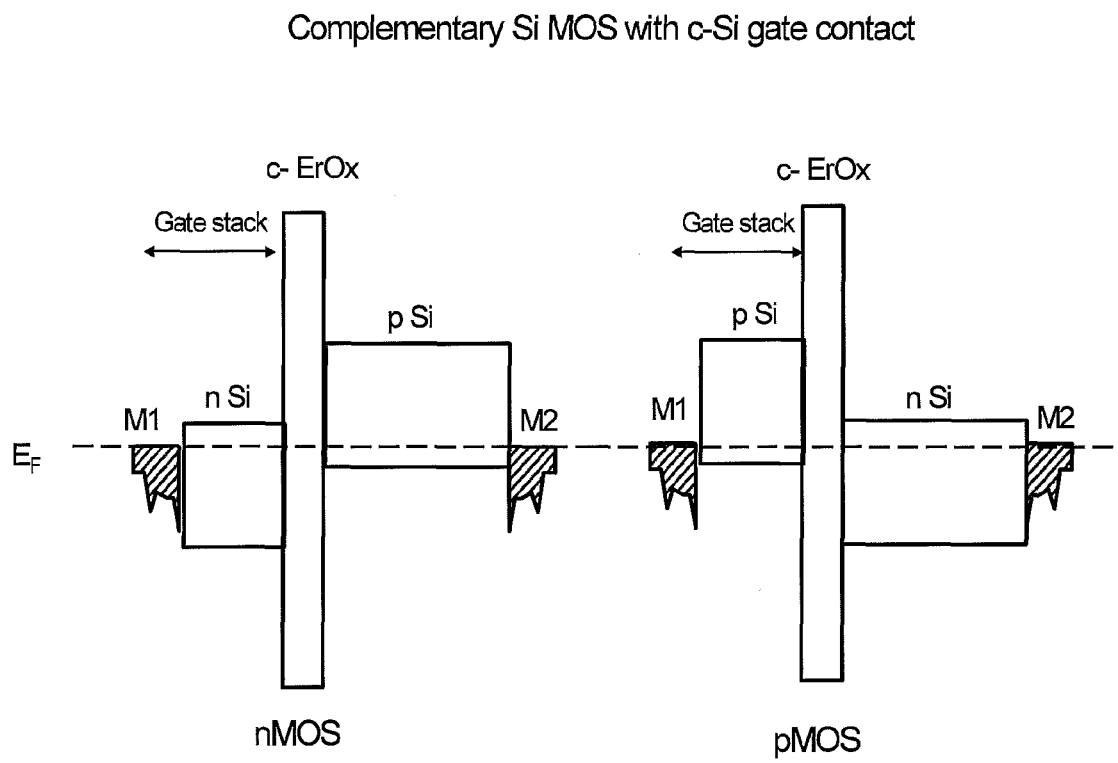

Figure 32: Novel gate stack structure for Si channel nMOS and pMOS devices using single crystal gate oxide and single crystal Ge gate electrode.
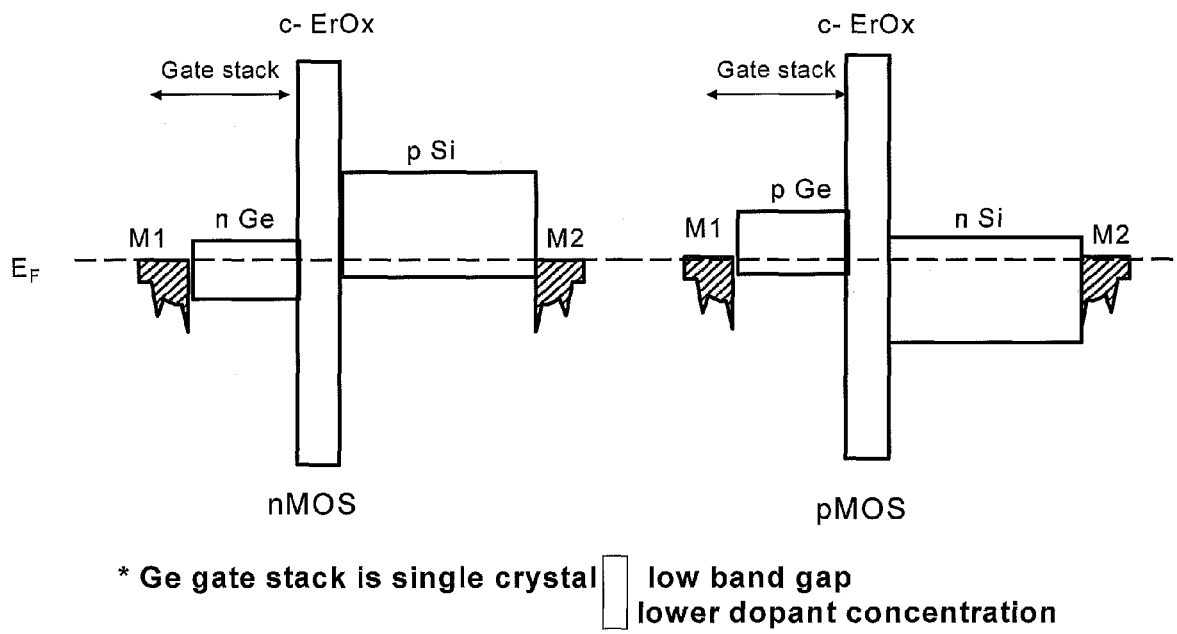

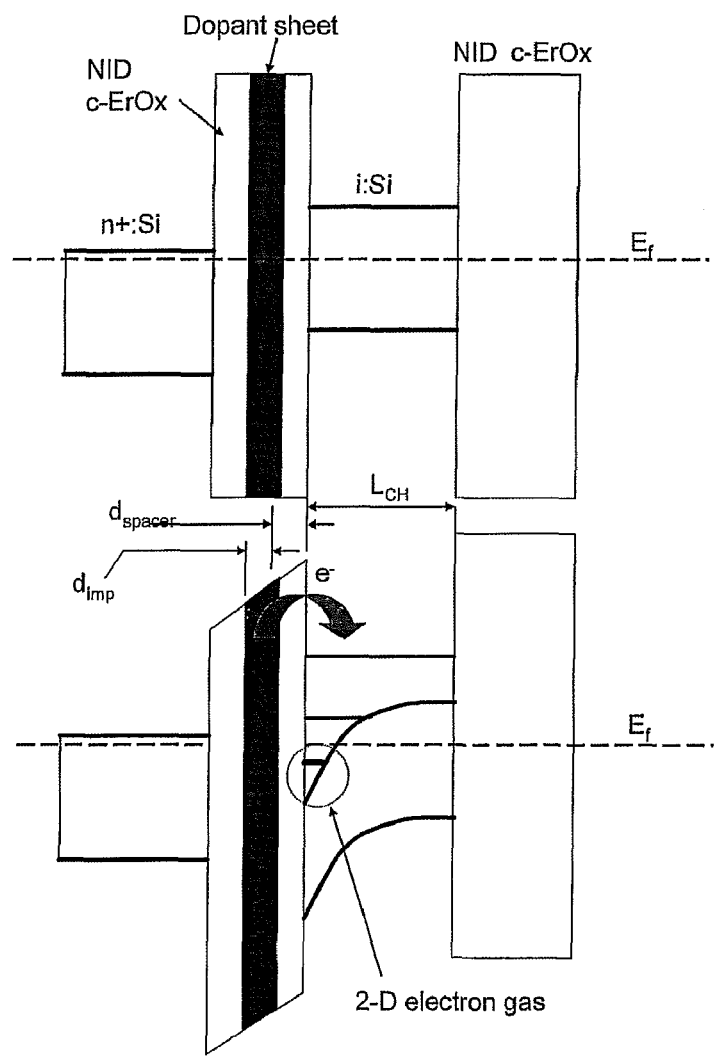
Figure 33: High electron mobility transistor based on Si/ErOx heterostructure with localized dopant sheet in the ErOx barrier.

SEMICONDUCTOR STRUCTURES WITH RARE-EARTHS

PRIORITY

This application claims priority from Provisional Application titled "Semiconductor Structures with Rare-earths" filed on Oct. 16, 2006, Ser. No. 60/852,445 included herein by reference in its entirety.

CROSS REFERENCE TO RELATED APPLICATIONS

Application and patent Ser. Nos. 09/924,392, 10/666,897, 10/746,957, 10/799,549, 10/825,912, 10/825,974, 11/022,078, 11/025,363, 11/025,680, 11/025,681, 11/025,692, 11/025,693, 11/084,486, 11/121,737, 11/187,213, U.S. 20050166834, U.S. 20050161773, U.S. 20050163692, Ser. Nos. 11/053,775, 11/053,785, 11/054,573, 11/054,579, 11/054,627, 11/068,222, 11/188,081, 11/253,525, 11/254,031, 11/257,517, 11/257,597, 11/393,629, 11/398,910, 11/472,087, 11/788,153, 60/533,378, 60/811,311, 60/820,438, 60/847,767, 60/876,182, 60/905,415, 60/944,369, 60/949,753, U.S. Pat. No. 7,018,484, U.S. 2006/0220090, U.S. 2006/0065930, U.S. 2006/0197124, U.S. Pat. No. 6,734,453, U.S. Pat. No. 7,023,011, U.S. Pat. No. 6,858,864, U.S. Pat. No. 7,037,806, U.S. Pat. No. 7,135,699, and U.S. Pat. No. 7,199,015, all held by the same assignee, contain information relevant to the instant invention and are included herein in their entirety by reference.

BACKGROUND OF THE INVENTION

1. Field of the Invention

The present invention is generally, but not limited to, the field of solid state devices. The instant invention discloses structures and methods for optimizing crystal lattice orientation for various applications.

2. Description of Related Art

U.S. Pat. No. 5,909,036 discloses a method of growing GaN on AlN using an optional buffer layer. U.S. Pat. No. 7,112,826 describes one method of achieving a crystalline layer of GaN on a non-gallium nitride substrate or undersubstrate by facet growth. U.S. 2004/0099871 discloses a method of growing GaN on silicon by forming silicon carbide on a silicon substrate. The prior art does not solve a key feature of the instant invention, namely enabling growth of a layer of, for example, silicon on a silicon substrate with a thin intervening layer wherein the top layer of silicon has a different orientation than the original layer of silicon.

BACKGROUND OF INVENTION

The opportunities in substrate engineering comprising design and fabrication for conventional silicon or other material wafer replacement may be grouped in at least two distinct groups—leakage reduction and mobility enhancement. Maintaining the pace of metal-oxide-semiconductor field-effect-transistor (MOSFET) device scaling has become increasingly difficult in the sub-100 nm gate length regime. Increased chip functionality and device performance drive further device scaling. However, simple scaling of the channel length and gate oxide thickness is no longer sufficient to deliver the ~17% yearly speed/power performance enhancement target for high performance logic device technologies.

Modern logic design is based on complementary-metal-oxide-semiconductor (CMOS) employing both nMOS and pMOS transistors. The primary advantage of CMOS logic gates is that logic elements only draw significant current between logic state transitions, thereby allowing power consumption to be greatly minimized—due to negligible dissipation in the off-state. This is clearly an advantage for high densities of devices in ultra large scale integrated (ULSI) circuits, such as, microprocessors and mobile devices. Unfortunately, sub-100 nm scaling of the channel length and gate oxide thickness adversely affects the off-state and on-state leakage and the mobility of the fundamental carriers, electrons (nMOS) and holes (pMOS).

There are at least two types of leakage power (i) active leakage power and (ii) standby leakage power. Active leakage power is defined as leakage power consumed by a nanoscale CMOS system when it is doing useful work and standby leakage power is consumed when the system is idle. The 90 nm technology node has seen leakage power increasing to as much as 40% of the total power consumed. The situation degrades further with scaling to 65 nm and below.

A taxonomy of leakage sources include device short channel effects (SCEs) such as sub-threshold leakage current and threshold voltage changes induced by the drain voltage (i.e.: drain induced barrier lowering, DIBL), and the high level of leakage current through the ultra-thin gate dielectric. These leakage currents cause higher static power dissipation. Active switching power is another key problem where a higher number of gates switching at high frequency with only modest reductions in supply voltage result in high active power density. The problems facing device scaling necessitate new solutions. The desired solution is one that enables continued critical dimension scaling at high yield, increases MOSFET drive current while reducing source to drain and gate leakage currents, reduces short channel effects, and reduces the active power density.

In 1989, IBM introduced silicon-on-insulator (SOI) substrate to alleviate leakage issues. The result of this work was partially depleted SOI (PD-SOI) technology. In 1994, using a quasi-0.35 µm CMOS SOI technology, PD-SOI was successfully implemented in the PowerPC 601 µP. A 25-30% performance gain over bulk CMOS was demonstrated, however, significant material and SOI circuit design techniques needed to be process qualified. Presently, 130 nm and 90 nm CMOS PD-SOI CMOS is available as standard foundry libraries. SOI technology represents a paradigm shift in the design of CMOS architectures, by improving performance via increasing device current drive while reducing leakage and keeping the power consumption low.

However, the 90 nm node is characterized by adopting PD-SOI for only high performance applications, notably by IBM, Freescale and AMD. To date Intel has the public position of not introducing SOI into mainstream production until the 45-32 nm node transition. Furthermore, Intel may resist introducing SOI products purely from strategic competitive reasons, such as not to give IBM/AMD and price advantage for higher volume SOI substrates. Scaling from within the 65 nm to the 32 nm node will require thinning of the PD-SOI physical structure towards ultrathin Si body and buried oxide fully-depleted SOI (FD-SOI). FIG. 1 depicts the device and substrate evolution as a function of technology node. Clearly, the present and future MOSFET architecture generations are firmly based on SOI substrate technologies. Notably, the distinction between the MOSFET structure and the SOI substrate is blurred and has become intimately part of the front-end-of-line (FEOL) process. Device architectures appear to remain planar and the vertical FET structures will begin to be considered for the 32 nm node. High performance logic is introducing localized stressors to boost mobility by generating tensile and compressive stress in the Si channel for nMOS and pMOS devices, respectively. Global bi-axially strained Si techniques for electron or hole mobility enhancement has been shown to be non-optimal for CMOS application.

The 32 nm transition point represents a potential disruptive path for introducing a fundamental process shift from the familiar planar single gate MOSFET towards non-planar FET structures (e.g., FINFET). Such a drastic non-planar process change may increase the obvious appeal of the planar double gate MOSFET which can be implemented using the present invention—discussed in detail later.

In parallel to high performance logic SOI applications, system-on-chip (SoC) applications are driving alternative SOI substrate solutions. SoC requirements of low power operation, portable RF applications and mixed analog-digital function drive implementation of high impedance SOI (HR-SOI). SOI offers advantages over traditional bipolar transistor designs as the insulator offers considerable reduction in crosstalk between mixed analog and digital circuits on the same chip. Radio-frequency (RF) circuits such low-noise amplifiers, oscillators and filters can be isolated via the substrate from the relatively noisy adjacent digital switching circuits via the insulating buried oxide. Introducing a high resistivity ($\rho \geq 3$ k$\Omega$·cm) substrate beneath the BOX further reduces RF losses and capacitive coupling, which is advantageous for passive elements such as inductors. RF-SOI has been demonstrated using CMOS, BiCMOS and SiGe HBT processes. These processes offer superior performance, functionality and cost compared to the now obsolete GaAs and InP based technologies.

CMOS circuits have traditionally been fabricated on bulk silicon substrates with a (100) crystalline orientation due to the high electron mobility and reduced Si/SiO$_2$ interface trap density. Hole mobility, however, is low in the (100) orientation, due to the relatively heavy hole effective mass. Measured electron ($\mu_e$) and hole ($\mu_h$) mobility for (100) bulk Si is shown in FIG. 2 as a function of FET channel inversion charge $N_{inv}$. Due to this large disparity in electron and hole mobility using conventional CMOS on (100) substrates, the drive current in n-channel MOSFET is twice as large as p-channel MOSFET. This pushes pMOSFETs to larger channel widths in static logic circuit designs. Therefore, pMOSFET performance lags considerably that of nMOSFETs. High speed CMOS circuit designs can optimize speed via emphasizing the use of nMOSFETs in dynamic logic—at the price of higher power consumption.

The desire to improve device performance and reduce the predominant sub-threshold leakage current has led to small channel lengths and forced aggressive scaling of the gate oxide thickness ($t_{ox}$). When $t_{ox}$ is reduced below 2 nm, the gate oxide enters the direct tunneling regime, and can exhibit leakage currents in excess of >10 A/cm$^2$. High dielectric, high-k, gate oxide replacement offer potential solutions to the direct tunneling leakage current. However, mobility for both nMOS and pMOS is considerably degraded using high-k gate metal oxide alternatives—due to poorer interface properties compared to gate oxides using SiO$_2$ or silicon oxy-nitrides (SiON). Therefore, there has been a compromise between low power consumption and high speed devices. Considerable efforts are now underway to create processes that increase the mobility to compensate the negative aspects of mobility degradation due to the introduction of high-k gate metal oxides e.g. Hafnium dioxide, HfO$_2$.

It is well known that considerable electron and hole anisotropy occurs for different bulk Si crystal orientations, for instance (100) versus (110), shown in FIGS. 3a and b. The measured carrier mobilities are shown in FIGS. 3c and d for (100), (110) and (111) bulk Si surface orientations. The curves are for MOSFETs using SiON gate oxide as a function of applied effective vertical field (proportional to the channel inversion carrier density). The electron mobility degrades by a factor of two for the (110) orientation relative to (100), whereas the hole mobility increases by 2.5 times. This represents the trade-off between optimizing the two carriers simultaneously in a single substrate orientation. The introduction high-k gate metal oxide replacement in order to exponentially decrease the gate leakage current is an important technology solution for the 65 nm technology node and beyond. Metal oxides, such as HfO$_2$, and the respective oxynitrides, e.g, HfON, are the leading candidates for SiO$_2$ gate oxide replacement. However, introduction of HfO$_2$ generates several integration issues with (100) substrates. It has been widely reported for CMOS fabricated on Si(100) substrates that carrier mobility is lower in CMOS with high-k metal oxide dielectrics compared with conventional SiO$_2$ or SiON, possibly due to fixed charge, charge trapping, interface roughness and remote phonon scattering. FIGS. 6a and b shows measured electron and hole mobility for various intra-planar directions for nMOS and pMOS fabricated using SiON and HfO$_2$ and (100), (110) and (111) oriented substrates. Clearly, the hole mobility of HfO$_2$ (solid lines) is consistently lower than that of oxynitride (dotted lines) on (100), (110), and (111) substrates. Hole degradation of about 5%-10% is observed for HfO$_2$ relative to SiON. Similarly, electron mobility degradation of HfO$_2$ devices mainly occurs at low inversion charge density (low vertical field). Therefore, fixed or trapped charges in the high-k materials have significant deleterious impact on mobility. At high inversion charge densities where mobility is limited by surface roughness scattering, electron mobility on (110) surfaces is the about the same for devices with HfO$_2$ and SiON gate dielectrics. Note that due to charge trapping, there is an uncertainty in inversion charge density which may shift the mobility curves of HfO$_2$ relative to SiON in FIGS. 6a and b.

Clearly, there is an advantage in orientation optimized substrates for SiON CMOS. The question is whether these relatively modest performance improvements are compatible with the large increase in substrate cost, process complexity and design optimization.

The "SOI-less", direct-silicon-bond, DSB approach does not solve leakage problems addressed by conventional SOI, however it does potentially generate a relatively well understood FEOL process compared to the previous two methods. Several issues still remain even for the DSB process. FIGS. 7a, b and c and FIGS. 8a and b are TEM's of direct silicon bonding. A high temperature rapid thermal anneal (900° C.) is required for SPE and the cost structure and layer quality of the initial hybrid substrate will be similar to conventional Smart-cut wafer bonded SOI. The increase in FEOL process steps and thus cost, coupled with the defect density increase due to implantation damage may be limiting factors. IBM has demonstrated that a thin Si(110) layer disposed on a Si(100) substrate can be completely transformed into a Si(100) orientation via Si implant disordering and subsequent SPE. FIG. 13 shows a 50 nm Si(110) converted to Si(100) with a relatively high damage region ~1500 nm below the surface of width ~50 nm consisting of Si dislocation loops. This high defect region will act as a source of charge trapping and dopant non-uniformity for substrate biasing. As leakage into the substrate and latch-up are always an issue, it is unclear how this defective region will interact within a CMOS circuit. Dislocation loops can be reduced via very high anneal (>1250° C.), however such high temperatures are problematic in 65 nm technologies and beyond. Unfortunately, yet another process complexity is required when dense pMOS and nMOS devices are fabricated next to each other. FIG. 14 shows a demonstration of 200 nm thick pMOS(110) region and SPE nMOS(100) region formed via an oxide spacer formed using shallow trench isolation. SPE Si seems to form corner defect regions near the oxide spacer edge and therefore a source for charge trapping. Remarkably, the Si(110) and Si(100) interface boundary can be completely transformed to a single orientation leaving no evidence of the wafer bond interface. This obviously places even higher cleanliness, defect density and particulate concerns compared to wafer bonded SOI. The wafer bond interface participates intimately in the SPE process and therefore will affect the quality of final SPE recrystallized region. Compare this to a conventional wafer bonded SOI wafer which has the active thin Si layer BOX interface formed by a high quality thermal oxide.

So, in the final analysis the cost of the "SOI-less" DSB hybrid orientation wafer, may actually be more expensive than a conventional SOI wafer bonded substrate. As the hybrid orientation substrate technology is intended for high performance applications it is unclear how the tolerances can be relaxed to make the process cost effective, even without factoring in the added FEOL processing complexity.

Approaching the 32 nm node, vertical MOSFET structures such as the FinFET, may replace the planar MOSFET geometry. The conducting channel in a FinFET device lies on the sidewall of a silicon pillar. In a standard Si(100) wafer, where the gate and active fin area are aligned either perpendicular or parallel to the wafer flat, the device channel lies in the (110) plane. If the transistor layout is rotated by 45° in the plane of the wafer, then the resulting orientation of the device channel is (100). An intermediate rotation yields electron and hole mobility between that observed in the (100) and (110) orientations—approximating the mobility behavior of a (111) surface. A very simple technique therefore, to achieve (100), (110), and (111) orientations using a vertical double gate FINFET is via drawing the devices lithographically at different intra-planar angles relative to the wafer flat or notch (FIG. 4). The optimum mobility scheme, in which nMOS lie in the (100) plane and pMOS lie in the (110) plane, can be accomplished by rotating the layout flat direction. This is accomplished on a standard (100) surface oriented Si layer—without the need for a complex and expensive hybrid orientation wafer. Note, for tri-gate vertical FET, the situation is considerably different. For standard double gate FinFET, the two gates act on the Si fin sidewalls, and the top ridge of the Si channel is isolated. In a tri-gate FET, there are three gates, two on the sidewalls and one on the top of the Si channel/ridge. This design relaxes the Si thickness required for the fully depleted SOI structure and makes it approximately 2 to 3 times thicker than the Si active layer thickness required for a conventional FinFET. The key feature advertised by Intel as an advantage of the tri-gate structure is that the Si layer thickness (100-300 Å) of the SOI wafer can be thicker (and therefore more manufacturable), and scales advantageously with gate length. A problem with the FinFET is the fin dimensions are scaled more aggressively than the gate length increasing cost of lithography.

Due to the tri-gate structure (or indeed surround gate structures) there is a negative impact on mobility because the orientation of the sidewall and top surface of the fin are different. The drain current will thus be related to the weighted average of the mobilities for the two orientations, which is dependent on the ratio between the fin width and height. For a (100) wafer, devices will be of the (110) orientation along the sidewalls and the (100) orientation along the top surface. It is therefore impossible to fully optimize both nMOS and pMOS drive currents simultaneously (i.e., place the entire nMOS device in (100) and the entire pMOS device in (110) because the orientation of the top fin surface will be shared by both device types).

Mobility enhancement via strain engineering is a major focus of performance CMOS enhancement. Compressive stresses can be introduced by shallow-trench-isolation (STI) towards channels longitudinally and laterally. In the Si diamond crystal structure, mechanical stress breaks crystal symmetry and removes the 2-fold and 6-fold degeneracy of the valence and conduction bands respectively. This changes the band scattering rates and/or the carrier effective mass, which in turn affect carrier mobility. However, nMOS and pMOS carriers have different interactions on the channel strain in three crystallographic directions. The mechanical stress on the device geometry, namely longitudinal, lateral and Si depth directions will therefore be coupled to electronic modifications.

BRIEF SUMMARY OF THE INVENTION

Structures and methods used to increase carrier mobility using engineered substrate technologies are discussed and disclosed. An optimum Si device technology comprises nMOSFETs lying in a (100) oriented plane and pMOSFETs in the (110) plane. For planar MOSFET geometries this is difficult—but could be realized by fabricating pMOSFETs along an etched sidewall formed via a trench.

For a given Si (100) substrate, the dependence of planar nMOS and pMOS transistors disposed upon the surface at various angles relative to the in-plane bulk Si crystal axes can show significant hole mobility modification. FIG. 4 depicts 0.5 μm buried type channel MOSFETS fabricated on a (100) substrate with channel oriented at 0°, ±45°, ±90° relative to the wafer flat <110> direction. Up to 4% pMOSFET mobility changes can occur, without significant electron mobility degradation.

The potential use of alternative bulk surface orientations has been studied in the past and shown to be beneficial in improving pMOSFET device performance. However, practical application of such a scheme has been limited by the degradation of device reliability due to interface traps at the gate oxide/bulk Si interface. Typically, for thick $SiO_2$ gate oxide it is found that the interface quality is considerably poorer for non-(100) surfaces. Recently, it was reported that with the gate dielectrics thickness now in the direct-tunneling regime, interface quality is no longer dependent on the silicon crystal orientation. The different interface bonds at the Si—O interface is schematically shown in FIGS. 5a, b and c. The $SiO_2$ gate oxides in the ultrathin regime (~2 nm) deposited on (111), (100) and 4°-miscut (100) exhibited the same uniformity and surface roughness. Reliability was found to be slightly higher in (111) case, with an enhancement in low field mobility for pMOS and degradation in nMOS. This removes the primary limitation of non-(100) silicon substrates using $SiO_2$ or SiON gate oxides, thus making them a viable option for the optimization of CMOS circuits.

In some embodiments of the instant invention an elegant solution to the complexity of generating hybrid orientation substrates is provided by a technique termed "Epi-twist". Epi-twist comprises single crystal rare-earth compounds, optionally, oxides, such as RE-Ox, deposited epitaxially on Si and/or Ge surfaces with (111) and (100) orientations; alternative orientations are possible also.

A new device structure is enabled by the use of single crystal rare-earth compounds termed silicon-on-nothing.

BRIEF DESCRIPTION OF THE SEVERAL VIEWS OF THE DRAWING(S)

FIG. 1: Possible MOSFET device architectures to be used in present and future technology nodes.

FIG. 2: Electron $\mu_e$ and hole $\mu_h$ mobility for Si(100) surface orientation as function of carrier density ($N_{inv}$).

FIGS. 3a,b,c,d: (a) (100) plane MOSFET, (b) (110) plane MOSFET, Electron (c) and hole mobility (d) for (100), (110) and (111) surface orientations for MOSFET using SiON gate oxide under applied electric field.

FIG. 4: Intra-planar orientation dependence of MOSFETS fabricated on a (100) substrate surface with channel oriented at 0°/±45°/±90°.

FIG. 5: Oxidation of (111), (100) and (100) 4° offcut bulk Si surface.

FIG. 6: pMOS/hole mobility (a) and (b) nMOS/electron for various bulk silicon substrate orientations for Si-oxynitride (dashed curves) and $HfO_2$ (solid) gate dielectric as a function of channel inversion charge density.

FIG. 7: (a) TEM of DSB of 50 nm Si (110) & Si(100); (b) TEM of Si implant and (c) SPE re-orientation to Si(100).

FIG. 8a: Direct silicon bonding of hybrid(110 to 100) orientation and a. (b) implant/anneal process used for Si(jkl)→ Si(j'k'l').

FIG. 9: Schematic showing one embodiment of epi-Twist technology to epitaxially deposit a Si(110) or Ge(110) active layer via a tetragonal REOx on a Si(100) substrate.

FIGS. 10(a) silicon (100) unit cell; 10(b) RE-oxide unit cell.

FIG. 11 Oxygen mediated template epitaxy of tetragonal REOx on Si(100).

FIG. 12: Epi-twist used to fabricate selective area epitaxy of pMOS(110) and nMOS(100) in Si or Ge.

FIG. 13: Epi-twist process steps used to fabricate selective area epitaxy of pMOS(110) and nMOS(100) in Si or Ge.

FIG. 14: Gate oxide scaling showing monolayer thickness of SiON required at the 65 nm node.

FIG. 15: Classical FD-SOI silicon layer thickness scaling $t_{Si}=L_g/3$, versus gate length.

FIGS. 16a, b, c, d: Key steps in Silicon-on-Nothing single gate planar MOSFET.

FIGS. 17a and b: Silicon-on-Nothing with localized BOX.

FIG. 18: Silicon-on-Nothing, SON, $L_g$=80 nm MOSFET with the "nothing" layer=20 nm $SiO_2$ localized BOX beneath the UTB 20 nm Si channel. A 3 nm (30 Å) gate oxide and poly-Si gate electrode are shown.

FIGS. 19a and b: A model of thick, (a), and thin, (b), BOX layers and electrostatic potential.

FIG. 20: Predictions of electrostatic integrity (EI) and required $t_{Si}$ for planar single gate (SG)-SOI and double gate (DG)-SOI.

FIGS. 21a and b: Silicon conduction and valence band energy-momentum dispersion of diamond crystal symmetry (a—left) unstrained; and (b) with Biaxial tensile strain.

FIG. 22: Bulk and biaxial tensile strained Si MOSFET showing effect on lowest lying conduction band energy ellipsoid distributions FIGS. 23a, b, c: TEM photographs (a) of the cross section of (110) strained-SOI MOSFETs (b) and the lattice image of the strained-Si(110) layer (c).

FIG. 24: Schematic of ideal $SiO_2$/Si heterojunction with atomically abrupt interface.

FIG. 25: Single quantum well (QW) composed of wide band gap insulator barrier layer sandwiching an ultrathin narrow band gap Si or Ge layer.

FIG. 26: HRTEM and RHEED of epi-SOI featuring 18 nm Si active layer and 6 nm BOX.

FIG. 27: RHEED of three layer epi-structure.

FIG. 28: Schematic of a four layer structure.

FIGS. 29a, b and c: Novel gate stack structure achieved by controlling the oxygen concentration.

FIG. 30: HRTEM of single crystal rare-earth oxynitride insulator deposited directly on (a) Si(100) & (b) Ge(100) surfaces.

FIG. 31: Novel gate stack structure for Si nMOS and pMOS devices using single crystal gate oxide and single crystal Si gate electrode.

FIG. 32: Novel gate stack structure for Si channel nMOS and pMOS devices using single crystal gate oxide and single crystal Ge gate electrode.

FIG. 33: High electron mobility transistor based on Si/ErOx heterostructure with localized dopant sheet in the ErOx barrier.

FIGS. 34a, b,c and d; Schematic of thick channel SOI, (a) and band structure, (b) versus a thin channel SOI, (c) and band structure, (d).

DETAILED DESCRIPTION OF THE INVENTION

Epi-Twist Technology

In some embodiments, Erbium or Ytterbium are used to form a cubic crystalline oxide (c-ErOx), wherein x may range from $0 \leq x \leq 5$. The electrical properties of ErOx, with a band gap of ~6 eV, make it a candidate as an insulator and possible high-k gate oxide. The optical refractive index of ErOx is very close to stoichiometric silicon nitride, $Si_3N_4$. In some embodiments single process deposition of epitaxial silicon is deposited on cubic-ErOx, with the rare-earth oxide itself deposited on Si (111) or (100) surfaces. The Si epi-layer retains the crystal orientation of the ErOx. The cubic-ErOx layer can be deposited under conditions such that the initial Si surface orientation is transferred to the Si cap—thereby generating an epitaxial SOI structure—epi-SOI. FIG. 9 is one example of an Epi-twist structure. In this example (110) ErOx is deposited on (100) silicon; sequentially (110) silicon is deposited on the (110) ErOx surface. Thus a different surface orientation Si(110) epilayer is formed upon the (110) ErOx surface relative to the Si (001) substrate.

In some embodiments, a rare-earth is chosen to form a REOx with a tetragonal unit cell, t-REOx; optionally a rare-earth compound may have a hexagonal unit cell; optionally a rare-earth compound may have a wurtzite unit cell. FIGS. 5a, b and c depicts schematically a prepared silicon (111), (100) and (100) 4° off surface terminated with oxygen atoms (gray). Similarly a Si(111) surface may also be prepared. The monolayer of oxygen atoms line up along the <110> directions of the dimmerized Si(100) surface. The unit cells of Si (100) and the tetragonal-REOx (t-REOx) are shown in FIGS. 10a and b. The tetragonal unit cell of the REOx has two equivalent axes of symmetry, 1105 and 1107, due to rectangular shape, as are shown in the FIG. 11. During epitaxy of the tetragonal-REOx, the oxygen atoms template epitaxy of the t-REOx crystal. FIG. 11 also shows oxygen mediated template epitaxy of tetragonal REOx on Si(100) surface. During epitaxy of the tetragonal-REOx, the oxygen atoms template epitaxy of the t-REOx crystal.

In one embodiment a relatively thin t-REOx layer is deposited (as low as a few monolayers), followed by epitaxial Si growth. The Si epi-layer takes on the orientation of the t-REOx. The two equivalent <110> orientations possible for the t-REOx result in crystal boundaries. Miscut Si(100) surfaces favor one orientation due to step flow. This is transferred to the Si epi-layer. Subsequent anneal of the structure recrystallizes these defects to form a high quality Si epilayer with (110) orientation. This simple selective area epitaxial hybrid orientation technique (SAE-HOT) is consistent with the requirements for mobility enhancement for pMOS(110) and nMOS(100) using only epitaxial methods. This technique can be far quicker and cheaper to implement than either Smart-Cut SOI or DSB approaches. FIGS. 12a and b are examples of achieving (110) Si or Ge devices, 1205, on a (100) Si substrate, 1201, with an nMOS device, 1210, formed on the original (100) substrate, 1201. Note the selective epitaxial growth of REOx, 1220, enabling the orientation change for device 1205. FIG. 12b shows an alternative construct.

FIG. 13 illustrates one process flow achieving device structures of FIG. 12. A first step, 1305, starts with, optionally, a silicon wafer of (100) orientation. A patterning and etch step, 1310, defines the location of a future MOS device and oxidizes the side walls, optionally; in this embodiment a rare-earth oxide is deposited over the wafer and then in 1320 CMP is used to remove the RE oxide from the field; in step 1325 an epitaxial layer, optionally silicon, is grown of selected orientation over the RE portion. Final device 1330 is produced by standard processing after step 1325.

FIG. 14 shows bulk Si CMOSFET gate oxide scaling using $SiO_2$ and SiON dielectrics for various technology nodes, with interpolated year of manufacture. As the gate oxide thickness approaches a few monolayers of SiON, the dielectric enters the direct tunneling regime and results in high gate leakage currents. An object of the present invention is the introduction of rare-earth based high-k dielectric for use in deep submicron CMOSFETs.

FIG. 15 plots the variation of active Si layer thickness ($t_{Si}$) as a function of gate length ($L_g$) and or technology node required to achieve fully-depleted SOI single gate planar CMOSFETs. It is an object of the present invention to incorporate rare-earth based insulators for use in fully-depleted epi-SOI structures. The scaling rule utilized $t_{Si} \sim L_g/3$.

It is an object of the present invention to integrate rare-earth based materials for the purpose of manufacturing epitaxially deposited hybrid orientation structures, and or FD-SOI and or high-k gate oxides. It is yet a further object of the present invention to integrate epitaxially deposited multi-gate structures using single crystal compositions of rare-earth based materials.

Special Case of Silicon-on-Nothing (SON)—Ultrathin BOX

A new SOI structure is disclosed with a silicon film of 5 nm and buried oxide of 20 nm, capable of suppressing SCE even at 20-nm channel length or less, which renders it competitive with vertical multi-gate structures. The requirements on thickness of both the Si and BOX films needed for such a SOI device exceed the present manufacturing capabilities of Smart-Cut/wafer bond and SIMOX technologies. In the current state of the art, the SOI film thickness ranges from 50 to 150 nm with the uniformity of ±10 nm (100 Å) across the wafer. The buried oxide is in the range of 50 to 400 nm, also with the uniformity of ±10 nm. Note, this current level of thickness non-uniformity influences approaches relying on local thinning of the commercially available SOI wafers by for example using the LOCOS process, due to the transfer of the non-uniformity to the thinned SOI film. Therefore, the claimed advantages of the layer thickness relaxation of the tri-gate discussed earlier come into doubt. In some embodiments of the instant invention a process called silicon-on-nothing, SON, enables fabrication of the desired SOI device capable of quasi-total suppression of SCE and DIBL and excellent electrical performances due to an extremely thin silicon (5 to 20 nm) and buried dielectric (10 to 30 nm) forming the BOX.

FIGS. 16a, b, c and d details key steps for prior art "SON" fabrication. The fabrication process of SON transistor starts from the conventional STI isolated wafers, FIG. 16a. Then, the epitaxy of SiGe layer 1605 is performed, followed by that of a silicon cap layer 1610, which will later serve as the transistor channel. The role of SiGe is for transferring the continuity of the lattice from the bulk to the silicon cap, thereby providing a mono-crystalline structure. Both epitaxial SiGe and Si layers can be much thinner and much better controlled than in any conventional SOI technology, since the epitaxial process is capable of performing the layers of nanometer scale thickness with excellent uniformity and resolution below 1 nm. After the epitaxy, conventional CMOS process steps are carried out until formation of the spacers 1615. Next, using anisotropic plasma etching, trenches 1620 in source/drain regions are formed in order to open access to SiGe, which is then selectively etched (via plasma).

The removal of SiGe from underneath the Si cap 1610 forms an air tunnel, which isolates the silicon film. The thickness of the tunnel remains equal to that of the SiGe layer. High selectivity plasma etching process (more than 100:1 for 20% Ge mole fraction) enables formation of very long tunnels ~150 nm per side The Si film is attached to the gate via gate oxide, which in turn is attached to the substrate. This air tunnel gives the SON name to the new architecture. Despite the air tunnel, the gate does not collapse because it bridges the active area and is supported at both ends on the STI, as in FIG. 16c. In the case of an empty tunnel, a passivation of its internal walls with a thin RTO oxide is used for preventing the tunnel from being refilled with silicon when rebuilding the source/drain regions by epitaxy. The tunnel may also be completely filled with a dielectric to form a super thin SOI-like device. After the lateral etching of SiGe and the tunnel formation, the tunnel can be optionally back-filled with a dielectric 1625. Thermal oxidation may be used for filling the tunnel with oxide. After oxidation, cleaning is carried out to prepare the silicon surface for the consecutive selective epitaxy. Then, the trenches in the S/D regions are filled with the selectively grown silicon. Implantation of the source/drain regions and RTA step complete the front-end process. The back-end process is conventional.

A cross-section of an exemplary prior art SON MOSFET 1701 is shown in FIGS. 17a and b. The BOX 1710 is not continuous (contrary to the case of conventional SOI) and is located only under the gate and spacers. The advantage of such an arrangement is reduced series resistance and easier silicidation, compared with conventional SOI of an equivalent silicon film thickness.

FIG. 17b shows a TEM of a portion of a SON structure directly beneath the gate oxide and 9 nm active Si layer, and back filled BOX.

In contrast to all other SOI fabrication technologies (SIMOX, BESOI, Smart Cut, ELTRAN, ELO, etc.), in the herein disclosed SON process, the silicon film and buried insulator, both of nm-scale, are defined by epitaxy on a bulk silicon substrate. As complicated as the disclosed process seems, an even more complex process is proposed in the ITRS 2003 emerging devices roadmap as a viable path at 45 nm and as a possible candidate as up to 20 nm technology node.

As shown in the TEM of FIG. 18, the SON (or SOI) transistors with very thin silicon films and thin buried oxide can be scaled down to 20-nm channel length while still maintaining the subthreshold slope below 80 mV/dec. It is interesting to note the body factor increases when thinning the buried oxide—but even in the extreme case of $t_{BOX}$=10 nm, the body factor value relevant to SON devices is much lower than that of PD-SOI and bulk devices.

The nomenclature of "nothing" in silicon-on-nothing is slightly misleading in that the final device may have the region beneath the channel filled with dielectric and the strength of process is being able to form an ultrathin thin Si body and BOX. Unlike conventional SOI, SON devices can have thinner BOX and is localized beneath the channel. This permits very shallow extensions and ground plane operation with deep heavily doped junctions just like in bulk Si MOSFETs. This feature keeps the series resistance of a SON MOSFET low and is also essential for silicidation that otherwise becomes problematic in the film MOSFETs.

The present invention teaches the use of single crystal rare-earth compositions epitaxially deposited to form buried dielectric and thin film active layers directly. Furthermore, selective etching of rare-earth based dielectrics can be used to remove the dielectric and form a true SON structure. Yet another object of the present invention is the use of single crystal compositions of rare-earth based semiconductors exhibiting semi-metallic nature (e.g., REP and REN) and can be suitable as a ground plane.

FIG. 19 shows the electrostatic field generated in thick (70 nm SiO2) and thin (10 nm SiO2) BOX FD-SOI CMOSFET, with $t_{Si}$=10 nm. The use of thin BOX FD-SOI reduces DIBL and SCE and thus improves CMOSFET performance. Clearly, epitaxial deposition of single crystal compositions of rare-earth based materials and Si and/or Ge can be used to achieve a thin BOX FD-SOI structure.

It is important to note that the SON process is extendable to the manufacture of planar double gate MOSFETs. The double gate planar MOSFET with inherent suppression of SCEs allows scaling to the end of the roadmap where 10 nm channel lengths are necessary. The speed superiority of double gate compared to single gate bulk is well documented. Several issues come to mind relating to self-heating effects and mobility increased materials. The SON device intrinsically is prone to increased self heating effects. This can be mitigated via the use of $Si_3N_4$ back fill, in some embodiments. The thermal conductivity of $Si_3N_4$ is considerably higher than $SiO_2$ and therefore, serves as a viable solution. Alternatively, the use of higher thermal conductivity BOX layers to manage self-heating effects is disclosed; as disclosed herein RE compounds have higher thermal conductivity. Alternatively, the Si channel layer is replaced with Ge.

To reduce the asymmetry in $V_t$ shift, the effect of the drain fringing field needs to be reduced, which can elegantly be achieved by reducing the BOX thickness. A better SCE in thin-BOX devices requires lower doping (i.e., lower RDF effect) to achieve a target off current. Thinner BOX also reduces the fringing field, which helps reduce the asymmetry in the $V_t$ shift. However, with a thinner BOX, due to a stronger coupling between the front and back gates, the $V_t$ becomes a stronger function of the doping density. Due to these counteracting effects, it is noted that reducing the BOX thickness $t_{Box}$=60 nm→20 nm, initially increases the $V_t$ variation (higher front-to-back coupling effect/body factor). However, for the case of a very thin BOX, $t_{BOX}$=10 nm, the variation tends to decrease (lower body doping and lower SCE).

A thin-BOX device structure is optimal for SRAMs in sub-50-nm FD-SOI technology. The use of lower body doping and negative back gate bias can further reduce the variability in an FD-SOI SRAM designed with thin BOX.

The electrostatic integrity, EI, of a device reflects its resistance to parasitic two-dimensional (2-D) effects such as SCE and drain-induced barrier lowering (DIBL). SCE is defined as the difference in threshold voltage between long-channel and short-channel FETs measured using small $V_{ds}$. FIG. 20 shows example calculations for different technology nodes. DIBL is defined as the difference in $V_t$ measured for short-channel FETs using a small and a nominal value for $V_{ds}$. A good EI means a one-dimensional (1-D) potential distribution in a device (as in the long-channel case), whereas poor EI means a 2-D potential distribution that results in the 2-D parasitic effects (e.g., thick BOX SOI). A simple relationship between SCE and DIBL on one hand and EI on the other has been established, as follows:

$$SCE = \gamma^{SCE} \cdot (\epsilon_{Si}/\epsilon_{ox})(t_{ox} \cdot t_{depl}/L_e^2) \cdot \phi_d \approx 2.0 \times \phi_d \times EI \quad (1)$$

$$DIBL = \gamma^{DIBL} \cdot (\epsilon_{Si}/\epsilon_{ox})(t_{ox} \cdot t_{depl}/L_e^2) V_{ds} \approx 2.5 \times V_{ds} \times EI \quad (2)$$

where $\phi_d$ is the source-to-channel junction built-in voltage, $V_{ds}$ is the drain-to-source bias, $\gamma^{SCE}$=0.80 and $\gamma^{DIBL}$=0.64 are empirical fit constants used to calibrate actual CMOS generations from 0.7 µm down to 0.1 µm.

EI is given by:

$$EI = (t_{ox}/L_e) \cdot (t_{depl}/L_e) \cdot (1 + x_j^2/L_e^2) \quad (3)$$

In the expression for EI, $x_j$ denotes the S/D junction extension depth, $L_e$ is the electrical channel length (junction-to-junction distance), $t_{ox}$ the effective electrical gate oxide thickness in inversion equal to the sum of the equivalent oxide thickness of the gate dielectric, the poly-Si gate depletion depth, and the so-called "dark space"), and $t_{depl}$ is the depletion depth in the channel. Note, "dark space" is the distance an inversion charge layer peak is set back in the channel from the $SiO_2$/Si interface due to quantization of the energy levels in the Si channel quantum well.

All conventional devices use classical $SiO_2$, amorphous $SiO_2$ BOX, amorphous SiON (a-SiON) gate oxide and polycrystalline Si (pc-Si) gate electrodes. The use of poly-Si gate contact suffers increasingly from poly-depletion effects as the MOSFET is scaled. Furthermore, dopant migration from the poly-Si into the gate oxide is particularly problematic for boron. A possible solution is the use of single crystal Ge (c-Ge) as the gate electrode—discussed later.

It is interesting to note the only practical method presently accepted to form the planar DG FD-SOI MOSFET is via the silicon-on-nothing process described in detail earlier. The instant invention discloses single crystalline rare-earth oxide, oxynitride and other compounds as insulators to enable a new method for fabricating planar DG FD-SOI structures. In fact, these new metal oxides allow epitaxial deposition of single crystal Si and/or Ge on top of a $REO_xN_y$ surface, in some embodiments. That is, multilayer single crystalline semiconductor/insulator structures are disclosed. The utility of such a new material structure expands the device architectures possible and enables construction of ideal planar DG MOSFETs.

The strength of non-classical CMOS structures, in particular of UTB devices, is clearly shown by the expression for EI above when applying the translation of parameters relevant to FD-SOI devices. Replacing $x_j$ and $t_{depl}$ by $t_{Si}$ (UTB single planar gate FD-SOI) or $t_{Si}/2$ (UTB double gate FD-SOI) permits a considerable reduction in the $x_j/L_e$ and $t_{depl}/L_e$ ratios. Note, PD-SOI does not participate in the above advantage.

The equation below for UTB DG ensures good EI [70]. Double Gate EI:

$$EI = [(t_{Si}/2)/L_e] \cdot [(t_{Si}/2)/L_e] \cdot (1 + (t_{Si}/2)^2/L^2_e) \leq \tfrac{1}{25} \quad (4)$$

$$SCE/\phi_d, DIBL/V_{ds} \leq 10\% \quad (5)$$

This new form of EI ensures very good electrostatic integrity for device scaling. The point here is, by just making the Si channel layer sufficiently thin excellent EI is achieved without the need for heavy channel doping (enabling reduced RDF) nor any ultra-shallow junction fabrication techniques. Note impurity ion scattering is a major source of channel mobility degradation. The instant invention discloses two-dimensional carrier transport in a channel free of impurity ion scattering.

FIG. 20 compares the EI between bulk Si planar, single gate (SG) FD-SOI and double-gate (DG) FD-SOI devices throughout the span of nodes covered by the ITRS 2005. The $t_{Si}$ scaling, although very aggressive, require 4- and 5-nm Si films at the end of the roadmap for high performance (HP), low operating power (LOP) and low standby power (LSTP). The potential to scale CMOS using double gate (DG) FD-SOI to the end of the roadmap with the SCE and DIBL at the same levels as the 90-nm node technologies is reassuring. EI≦10% (meaning DIBL of <25% $V_{ds}$) is assumed as the acceptable range as represented by the lower region in FIG. 20. Note, the EI of planar bulk is outside the allowed zone at the 100-nm node for HP, near the 65-nm node for LOP, and between the 90- and 65-nm nodes for LSTP products. Presently, the 2006 HP transition between 90 nm and 65 nm node continues to use bulk Si even though an increased EI penalty (EI~0.13@65 nm) has resulted. This is due to the technical and economic issues relating to implementation of SOI. Therefore, the benchmark for EI relating to singe gate (SG) FD-SOI is the 65 nm node using bulk Si. Therefore, the EI levels achievable by SG FD-SOI allow continued fair EI scaling rules up to the 32 nm node—depicted by the blue region.

Strain & Quantum Confinement Effects in Ultrathin Body Double Gate-MOSFETs

The introduction of homogeneous strain in a single crystal semiconductor produces changes in the lattice parameter and crystal symmetry of the material. This in turn produces changes in the electronic band structure and vibrational modes. Homogeneous strain can be grouped into two contributions: (i) isotropic or hydrostatic components, which give rise to a volume change without disturbing the crystal symmetry; and (ii) the anisotropic component which in general reduces the symmetry present in the strain free material. The effect on the electronic states of the semiconductor is to alter the energy gaps and remove degeneracy if symmetry is reduced. Effective carrier masses m* are affected by the variations in the energy-momentum dispersion as well as by changes in the interband matrix elements. The strain dependence of the electronic levels is characterized by deformation potentials, (i.e., the energy shift per unit strain), typically in the range of 1-10 eV. A shift in the phonon frequencies (i.e., vibrational states) of the solid occurs due to modification of the crystal symmetry. Si and Ge are indirect band gap diamond semiconductors.

FIGS. 21 a and b schematically depicts the electronic band structure dispersions for the conduction and valence bands of bulk unstrained Si (left) and for the case of biaxial tensile strain (right). The wave vector k∥ lies in the plane of Si channel and $k^\perp$ lies in a direction normal to the plane of the Si surface, presumed to be along (001). Hole populations of the HH and LH bands in unstrained Si are localized to wave vectors close to the brilluoin zone-center, k~0. The hole effective mass is averaged between the HH ($m_{HH}$*=0.54) and LH ($m_{LH}$*=0.15). Under biaxial tensile strain the LH and HH bands split at k=0, and the LH becomes the maximal valence band. The separation of the LH and HH bands has several advantages for MOSFET dynamics. Intervalley scattering between the LH and HH bands is reduced and the E-k dispersion is warped such that the curvature is increased—thereby decreasing the effective mass and increasing the carrier mobility, ($\mu = q_e \tau/m^*_{eff}$). The effect of biaxial tensile strain on the conduction band also modifies the lowest lying electron band. The symmetry of the unstrained six-fold degenerate $\Delta_6$ band is reduced with biaxial tensile strain and splits into a lower energy 2-fold degenerate $\Delta_2$ and higher energy 4-fold degenerate $\Delta_4$ multiplet. The $\Delta_6$ energy ellipsoids depicted in FIG. 22 are oriented along the principle wave vector directions as shown, becoming distorted with biaxial tensile strain. Reduced intervalley scatter is also advantageous in MOSFET channel transport. FIG. 22 gives a schematic representation of the above.

In order to realize high-speed scaled CMOS devices, it is desirable to increase the carrier mobility at the sub-100 nm regime. The drain current/drivability in p-MOSFETs, is dominated by lower inversion hole mobility. The disparity between electron and hole mobility results in an unbalance between n- and p-channel drivability. Strained silicon-on-insulator (sSOI) CMOS devices on (100) surfaces can be used to form a strained-Si channel with higher carrier mobility using a relaxed SiGe-on-insulator (SGOI) substrate. As discussed earlier, p-MOSFETs on a (110) surface are also candidates for overcoming this issue because the hole mobility on (110) surface is about two times as high as on (100) surface. However, the electron mobility of (110) n-MOSFETs is significantly lower and about one half of (100) n-MOSFETs. In (110)-surface CMOS technology the lower electron mobility is a potential problem for increasing the CMOS current drive. As a result, efforts to develop a new device technology for suppressing the lowering of the electron inversion mobility in the (110)-surface CMOS has emerged. Tensile strained Si is a potential solution.

The (110) tensile strained-SOI substrate shown in FIGS. 23 a, b and c can be realized by epitaxially growing a 30 nm strained-Si film, 2310, on (110)-surface relaxed Silicon-Germanium-on-Insulator (SGOI) structure, 2301. The (110) SGOI substrate was fabricated via Ge condensation technique of a 200 nm $Si_{0.9}Ge_{0.1}$ layer deposited directly onto a Si(110)-surface. The initial Si(110) layer was a hybrid orientation wafer bonded SOI substrate with (111) cut plane (SOI parameters are: $t_{Si(110)}$=35 nm and $t_{BOX}$=300 nm). SiGe layers with Ge concentration above 10% are known to produce deleterious crystal defects due to the large lattice mismatch and are limited via the critical layer thickness. Pseudomorphic (i.e., elastic) strained SiGe on Si(110) results in the highest structural quality SiGe layer with minimal cross hatching defects, however, the in-plane lattice constant will be equivalent to the underlying Si(110) in-plane lattice constant. Therefore, a Si(110) layer deposited on this relatively thin SiGe layer will potentially only have lattice constant equal to unstrained Si(110). To produce a SiGe(110) surface with large in-plane lattice constant to allow a Si active layer to undergo tensile strain requires the SiGe layer to be relaxed to its free-standing state. A method to relax the SiGe layer lattice constant is to form a relaxed layer via the aforementioned Ge condensation.

A 130 nm (110) relaxed-SGOI substrate was realized by thermally oxidizing the strained-$Si_{0.9}Ge_{0.1}$ layer using the Ge condensation technique at 1200° C. Ge atoms are rejected from the surface oxide layer down into the remaining SiGe layer. The Si/Ge interdiffussion process determines the uniformity of Ge % within the remaining SiGe layer. By appropriate choice of the initial Si(110) layer thickness, epitaxiallly deposited SiGe thickness, Ge % and thermal oxidation temperature/time a relatively uniform SiGe layer with increased Ge % can result via selective Si consumption to produce the $SiO_2$ thermal oxide. Ge atoms diffuse toward the Si(110)/BOX interface, and ultimately into the lower Si(110) layer to form SiGe. The resulting thinner SiGe structure with higher Ge content will be free standing if the lower Si(110) layer is alloyed. The topmost $SiO_2$ can now be removed and an epitaxial Si(110) layer deposited that will be strained to this relaxed SiGe layer. FIG. 23a shows TEM photographs of the cross section of (110) strained-SOI MOSFET 2301 and the lattice image of the strained-Si(110) layer 2310. The lattice image shows the smooth strained-Si surface. Process steps for Si(110) tensile strained layer is via epi strained-$Si_{0.9}Ge_{0.1}$ layer on the Si(110)-surface bonded-SOI substrate followed by thermal oxidation process using a Ge condensation (Ge %) technique to relax the $Si_{0.9}Ge_{0.1}$ layer and to increase the Ge content to 25% in the remaining SiGe and initial Si(110) layers. The topmost thermal oxide is removed and epi-Si is deposited on the relaxed SGOI substrate. Ge % concentration versus depth is shown in FIG. 23(b).

It is worth noting, a very thick layer of SiGe can be deposited directly on a Si surface, exceeding the critical layer thickness to produce relaxed SiGe. Graded Ge profiles and SiGe/Si superlattices can be used to suppress threading dislocations, however the final material quality is riddled with surface/bulk defects and non-uniformity. Typically, SiGe layer(s) in excess of 5 µm is required to generate relaxed compositions with Ge %~25%. Such a technique is not optimal and very expensive and time consuming. Furthermore, it is well known that high quality SiGe epitaxy on (110)-oriented surfaces is extremely difficult.

The Ge-condensation technique solves the technical requirements for producing tensile strained Si(110), however suffers all the cost disadvantages of wafer bond/Smart-cut with the added complexity and cost of a tightly controlled epi/oxidation process to form the relaxed SiGe template followed by yet another Si epi deposition step.

FIG. 23c shows the schematic two-dimensional energy ellipses for (110)-surface Si conduction band under tensile strain condition. It is expected that the tensile strain parallel to the (110)-surface induces the energy splitting between the $\Delta_4$ fourfold and the $\Delta_2$ twofold valleys, leading to the $\Delta_4$ energy level to be lower than the $\Delta_2$ valley [11]. Note, the energy level of the $\Delta_2$ twofold valleys of the (100)-surface Si conduction band is lower than that of the $\Delta_4$ fourfold valleys [12]. Therefore, the reduced inter-valley scattering between the two- and the fourfold valleys can be reduced. For the case of strained-Si(110), shown in FIG. 22, the electron mobility has the maximum value along the [001] direction and the minimum one at the [110] direction, because the conductivity mass of the fourfold valley is the lowest along the [001] direction and the highest at the [110] direction. As a result, the electron mobility, especially along the [001] direction, of the (110)-surface strained-Si channel structures can be enhanced, because of the reduced inter-valley scattering and the lower effective mass of electrons, similar to the case of electrons in the (100)-surface strained-Si n-channel.

According to the theory of the (110)-surface valence band modulation under the compressive stress parallel to (110)-plane, it is expected that the Si(110) energy levels of the LH and HH bands will split by the tensile strain, resulting in the hole mobility enhancement by the reduction of the interband scattering between the light and the heavy hole bands—similar to the theory concerning the (100)-surface valence band under tensile strain discussed previously. According to the anisotropic effective mass behaviors of holes at (110)-surface unstrained-Si channel it is expected the hole mobility has the peak value along the [110] direction and the minimum value at the [001] direction.

Strained-Si(110) CMOS devices have been experimentally demonstrated showing electron and the hole mobility enhancement of (110)-surface strained-SOI devices amounts to 23% and 50%, respectively, against the mobilities of (110)-surface unstrained MOSFETs (refer to FIGS. 2 and 6). As a result, the electron and the hole mobility ratios of (110)-surface strained-SOI MOSFETs to the universal mobility of (100)-surface bulk-MOSFETs increase up to 81% and 203%, respectively.

Therefore, the current drive imbalance between n- and p-MOS can be reduced. The carrier mobility of the (110)-surface strained-SOI MOSFETs strongly depends on the current flow directions. The electron mobility has the maximum value along the <001> direction and the minimum one along the <110> direction. On the other hand, the hole mobility along the <110> direction is the maximum value, and that along the <001> direction is the minimum. Therefore, it is necessary to appropriately choose both the surface orientation and the current flow direction for optimizing the (110)-surface strained-CMOS performance.

The gate delay time can be used as a figure of merit for quantifying the expected surface orientation dependence of the strained SOI(110) CMOSFETs. Using the universal relationship between high field carrier velocity $v_{c\,(c=n\,or\,p)}$ and the low field mobility µ ($v_c \propto \mu^{0.42}$), the gate delay time can be defined as $t_{gd}=L_{eff}(1+v_n/v_p)/v_n$, where $L_{eff}$ is the effective channel length.

The dependence $t_{gd}$ on mobility enhancement and current flow directions for strained-Si(110) and Si(001), taking the Si(100)-surface unstrained-CMOS as 1. The $t_{gd}$ improvement is about 20% in the (110)-surface strained-CMOS is almost the same as that in the (100)-surface strained-CMOS. By optimizing the surface orientation to (100)/(110), the best solutions for n- and p-MOS are the (100)- and the (110)-surface, respectively, and the improvement of $t_{gd}$ amounts to about 30%. The optimal pMOS current flow direction is not surprisingly with <110> channel directions only, due to the reduction in symmetry. This last point indicates that although there are significant improvements in mobility to be obtained for (110) surface orientations, the orientation of the single gate planar MOSFET channel will be have highly directional enhancement in current. Introducing biaxial tensile strain will not only enhance the mobility but will also exacerbate the direction asymmetry. The use of symmetric Si(111) surfaces on the other hand, may potentially not provide as high a mobility enhancement, but may provide less directional dependence in the channel current enhancement.

Quantum Confinement Effects in UTB FD-SOI & GOI

The effect of stress along various crystal directions (e.g., (001), (110), (111), (211) etc.) on the electronic band structure of cubic semiconductors is well understood. The modification of the electronic band structure and transport properties of Si and SiGe by the use of uniaxial and biaxial strain has been discussed. Another mechanism that can be used to modify the electronic properties of ultrathin body (UTB) Si is via quantum confinement effect (QCEs). Unlike strained Si MOSFETs, however, investigation of UTB FD-SOI with Si channel layers approaching 10 nm (i.e.; approaching quantum confinement effects) has not been studied in great detail. Conversely, quantum well and superlattice structures composed of $Si_xGe_{1-x}$/Si Ge/$Si_xGe_{1-x}$ and Si/Ge have been studied extensively—in fact they were the subject of intense theoretical and experimental work dating back to the 1970's where molecular beam epitaxy techniques were first realized. Note that $Si_{1-x}Ge_x$ alloy has a smaller band gap semiconductor than Si, ($E_g$(Si)=1.12 eV & $E_g$(Ge)~0.66 eV). The complexity of Si-Insulator heterostructures has historically been limited by the fact that no suitable single crystal oxides/insulators have been available with the required heterojunction conduction ($\Delta E_c$) and valence ($\Delta E_v$) band offsets with Si. The absence of epitaxial wide bandgap oxides/insulators places severe limitation on the construct of Insulator/Si/Insulator quantum wells (QWs). Fortunately, Si forms an excellent native oxide with unsurpassed interface quality and underpins the entire CMOS industry. $SiO_2$ has a large effective band gap ($E_g$ ($SiO_2$)~9 eV with $\Delta E_c$ and $\Delta E_v$ roughly equally partitioned) amorphous with no long range crystallographic order—thereby limiting the construct of multilayer $Si/SiO_2$ structures with ultrathin layer thickness.

Nanoscale CMOS devices using bulk Si and PD-SOI have Si layer thickness in the range of $0.05 \leq t_{Si} \leq 1$ µm. By definition the gate oxide for a planar gate MOSFET is required to have minimal leakage current and can therefore be assumed to act as a potential barrier to both carrier types in the channel layer.

The Si channel can be treated as bulk material with energy-momentum dispersion in the plane (E-k$\|$) similar to the z-direction. as shown in the left portion of FIG. 22. A BOX layer will also behave as an energy barrier. If the insulator-channel interface is atomically abrupt, a well defined discontinuity in the potential energy occurs with conduction $\Delta E_c$ and valence $\Delta E_v$ band offsets. The electronic band structure of bulk-like devices can be modified via strain but for the present discussion will be assumed to be unstrained. Bulk-Si and PD-SOI devices alike exhibit similar channel transport with electronic energies forming a continuum in the conduction and valence bands of Si—potentially confined via the $SiO_2$ barriers from tunneling and thermionic emission along the z-direction.

Nanoscale CMOS devices using FD-SOI have Si layer thickness in the range of $50 \leq t_{Si} \leq 250$ Å and FD-GOI $50 \leq t_{Ge} \leq 500$ Å. A 2-D quantum well (QW), FIG. 25, is a potential well that confines carriers in one dimension, forcing them to occupy a planar region. The effects of quantum confinement take place when the quantum well thickness becomes comparable at the deBroglie wavelength of the electrons and holes, leading to energy levels called energy subbands $E^{i=e,h}_n$, i.e., the carriers can only have discrete energy values. Therefore, for FD-SOI with gate oxide, the Si channel layer becomes the QW.

The unique confinement effects of the QW in the FD-SOI structure distorts the E-k$\|$ dispersion and decouples the HH and LH energy bands. The quantization energies of electron and hole subbands primarily depends on the carrier effective masses, the QW width and the height of the potential barriers.

Typically, the onset of quantization effects in FD-SOI does not occur until $t_{Si}$ approaches 100 Å. The deBroglie wavelength is inversely proportional to the effective mass ($\lambda_e \propto 1/m^*$), and therefore lighter carriers such as electrons and LH become confined with physically larger QW dimensions. For Si, channel layers approaching 100-150 Å experience quantization effects. The quantum confinement modifies the energy dispersion close to the extrema such that $E(k)=E(k^\perp,k\|)=(h/2)(k_\perp^2/m_T+k_\|^2/m_L)$, where the Si and Ge electron effective masses are $m^*_{T\,e}$(Si)~2.32$xm^*_{T\,e}$(Ge). Therefore, the approximate FD-GOI channel layer thickness where QCEs will become important will be in the range ~230-350 Å.

FIG. 25 shows a schematic quantum well (QW) composed of wide band gap insulator barrier layer sandwiching an ultrathin narrow band gap Si or Ge. The potential energy discontinuity is indicative of an atomically abrupt interface. For well thicknesses $L_w$ in the range of the deBroglie wavelength quantization of the allowed energy levels in QW occurs. The trend in the quantized energy levels as $L_w$ is reduced in thickness is shown.

FIG. 24a schematically shows a conduction band energy profile as a function of direction vertically through a CMOSFET comprising $SiO_2$/Si heterojunction. FIG. 25 schematically shows a single gate planar fully depleted GOI MOSFET, approximated as an ideal QW. Note the potential energy diagram is equally applicable to an ultrathin channel double gate MOSFET. The number and energy separation of quantized energy levels in the well depend strongly on the well dimension. As $L_w$ becomes significantly smaller than the electron deBroglie wavelength, the energy separation $\Delta E$ of the first quantized energy level $E^e_{n=1}$ relative to the bulk well material conduction band edge $E_c^{QW}$ increases. For the extreme case of $L_w$~$0.1\lambda_e$, the quantized electron energy $E^e_{n=1}(k_\perp)$ is allowed only for relatively high energies in the potential well. For the case of FD-GOI, if $L_w$ is scaled aggressively such that $L_w$~$0.5\lambda_e$, the simple single conduction band approach will breakdown and higher energy conduction bands will need to be included.

In summary, both strain and QCEs can significantly modify the bulk Si and Ge electronic bandstructure. Single and double gate FD-SOI and GOI with active layer dimensions of the order of the deBroglie wavelength of electrons require QCEs to be fully accounted for. Pseudomorphically strained single crystal insulator/semiconductor QWs further simultaneously affect both strain and QCEs. For the case of the present invention utilizing REOxNy/Si/REOxNy heterostructure, the strain and QCEs can be tuned via REOxNy composition and layer thickness.

Planar Double Gate & Box MOSFETs

The advantage of a planar, double gate MOSFET, DG-MOSFET, is the drastically improved electrostatic integrity performance for highly scaled devices. Approaching the 22 nm node the planar single gate FD-SOI MOSFET significantly compromises good EI design rules. The double gate device designs at present predominantly favor the use of vertical channel devices such as the FinFET, however basic design issues relating to the manufacturability of the underlying conventional SOI substrate technology has been questioned. The vertical channel DG device represents a fundamental CMOS processing change and will incur a large cost penalty. The advantages of good EI and packing density may not be enough to assure vertical channel introduction into mainstream manufacture. Switching from conventional planar to thick BOX SOI FinFETs means changing from conventional four-terminal devices to three-terminal floating body devices. This narrows the circuit operation because of the three-terminal characteristics. Four terminal body-tied FinFET structures rely only on bulk-Si substrates, however, the same inter-device leakage problems faced by present day bulk-Si CMOS remains. Therefore, the simultaneous low power application of such a design methodology comes into question even though the advertised advantages are low wafer cost, defect density, no floating-body effect and better heat dissipation compared to SOI FinFETs. Regardless of whether bulk or SOI FinFET design is used, vertical channel devices rely on aggressive lithography performance, potentially requiring channel layers to be scaled with significantly higher precision than the gate length. A technique to preserve the planar processing methodology and generate the required DG structure was discussed earlier via the SON process.

Idealized planar double gate, DG, device designs are differentiated by use of conventional SOI substrate, selective area epitaxy of SOI and the use of single crystal insulator. Furthermore, the introduction of Ge into either or both the channel and gate electrode region is disclosed.

Strain can be adequately introduced via SiN cap stressors. Alternatively, the use of single crystal insulators as gate oxides and or oxynitrides affords a unique advantage for gate stack design.

In one embodiment a CMOSFET comprising a Si channel, can be tuned to be in tensile or, optionally, compressively strained via the use of single crystal gate dielectric and gate stack compositions. For example, a Si channel can be utilized with single crystal REON dielectric and subsequent doped single crystal Ge gate contact. The REON and Ge layers impart opposite stressor components to the Si channel by virtue of different lattice constants relative to Si. Alternatively, a CMOSFET comprising a Ge channel may be tuned in a similar fashion.

Selective Area Epitaxial Growth

Current demands for a system-on-chip device integrating digital logic and memory are increasing. Integration of mixed analog (e.g., RF transcievers, analog-to-digital conversion and low noise amplifiers) and digital logic functions is also necessary for mobile device libraries. A key enabling technology is to fabricate high speed and low-power transistors on silicon-on-insulator (SOI) wafers. However, the BOX layer requires an optimized fabrication process and design for the SOI-based devices. Some devices, such as dynamic random access memories (DRAMs) with deep trenches as a storage node, cannot easily be embedded with other devices on an SOI wafer with conventional DRAM processes for a bulk silicon wafer. This is because the trench depth is typically 5 to 10 μm—much larger than the thickness of an SOI layer. A floating body cell (FBC) is one of the candidates for embedding DRAM with SOI. However, a floating body effect potentially causes data sensing errors in the FBC and deteriorates the DRAMs' performance.

A hybrid SOI wafer having both an SOI region and bulk-silicon region is a candidate technique for realizing the embedded device on an SOI wafer. Since there is no BOX layer in the bulk-silicon region, a hybrid-SOI wafer enables a flexible design of the device, and various embedded devices can be fabricated with conventional processes used in the fabrication of the devices on a bulk-silicon wafer.

Germanium-on-Insulator

Germanium MOSFETs were abandoned forty years ago because Ge lacked a reliable and native insulator like $SiO_2$. The recent introduction of high-k gate dielectrics, coupled with the higher inherent mobility of Ge now makes Ge MOSFET an attractive evolution. Germanium has a higher low field electron and hole mobility compared to Si and therefore offers the potential of higher drive current. Silicon is by far the most used semiconductor. The electron mobility is modest compared to others, however as discussed before nMOS and pMOS are required for modern CMOS. Therefore, hole mobility must be considered on an equal level when considering alternatives. Clearly, Ge provides an excellent increase in both electron and hole mobility. There exists other III-V and II-VI materials with higher mobility, but they suffer from very small electronic bandgaps and or very low melting points (e.g. InSb and HgTe). The CMOS industry is most comfortable with Ge chemistry and has a long history of use.

As has been published frequently, the electron mobility as a function of the inversion charge for SOI devices with the film thickness $t_{Si}$=3-20 nm as a parameter (a thick BOX is assumed) declines by nearly a factor of two with Si film thickness at low fields (inversion). This is due to the variation in quantization of electron energy levels within the Si quantum well sandwiched between two $SiO_2$ potential barriers (viz.: gate oxide and BOX) as a function of $t_{Si}$.

Clearly, the Ge(111) orientation is superior to both (100) Si and Ge, in two respects. First, the mobility of ultrathin Ge(111) films is greatly enhanced. Second, there is a relatively large mobility enhancement of Ge(111) over a wide range of film thickness. The mobility enhancement of Ge(111) can improve the MOSFET GOI drive current. Therefore, it would seem, that ideal choice for next generation mobility enhanced channel replacement material would be Ge and further preferably Ge(111) orientation.

GOI Manufacturing Methods

There are recent efforts for realizing various Ge channel layers on bulk Si and insulating structures, (A) Smart-Cut wafer bonding; (B) Direct epitaxy of Ge onto Si(100); (C) Ge condensation technique; and (D) Small area seeded Ge epitaxy flow on SiN amorphous layer. Wafer bonding using conventional Smart-cut SOI process is appealing but large Ge bulk wafers are very costly and only available up to 200 mm in limited volume. This precludes 300 mm GOI manufacture at present. Umicore, is the only large wafer diameter Ge(100) CZ wafer producer and has only recently demonstrated proof of concept 300 mm CZ Ge(100), (Umicore recently joined forces with SOITEC). To circumvent the 200 mm bulk Ge wafer limitation, epitaxial Ge can be deposited using a hydrogen mediated low and high temperature deposition technique. However, due to the large lattice mismatch between Si and Ge (4.2%) a thick (>250 nm) highly defective Ge buffer is required before relatively low defect density epi-Ge can be grown suitable for channel material. If this approach is used to generate a Ge layer suitable for Smart-Cut layer transfer then a high quality Ge layer greater than 200 nm (8") is required to accommodate the H-cleave layer. Furthermore, multiple recycling runs would be required to make wafer bond economically viable. COP defect reduction is necessary in high quality CZ Si substrates. In either Ge epi layers or bulk transferred layers, COP defects in Ge have not been studied. The Ge-condensation technique is appealing for thin film GOI. A SiGe layer is oxidized using the selective oxidation of Si to leave behind a Ge film. Unfortunately, the problems of high levels of threading dislocations and cross-hatching inherent in the initial high Ge % SiGe layer deposited is transferred to the remaining Ge film. Seeded flow of Ge on $SiO_2$ and or $Si_3N_4$ films has also been demonstrated using LPE technique. This is a very high temperature and small area technique.

The instant invention discloses an epitaxial technique capable of depositing thin film single crystal insulating oxide on Si(100) and Si(111) surfaces. In some embodiments, additional Si and Ge films are deposited in the ultrathin regime (1-1000 nm) upon a thin film single crystal insulator suitable for fully depleted SOI and GOI on (100) and (111) orientations. Ge(111)-on-insulator is obviously and excellent opportunity for an epitaxial technique as the process is simple, cost effective and can provide the layer thicknesses required in both the channel layer and BOX. The present invention discloses a Ge(111)/REON/Si(111) heterostructure suitable for FD-GOI utilizing large area single crystal bulk Si substrates.

High Thermal Conductivity BOX

Self-heating effects observed in Si CMOS FETs and SiGe HBTs fabricated on SOI substrates are problematic for high performance designs. Conventional SOI substrates have a low thermal conductivity insulator ($SiO_2$ is ~100 times less than Si) layer that reduces conduction cooling from the device layer through to the bulk Si substrate.

Thermal analysis of typical CMOS structures show the relative cooling paths for Joule heat dissipated in the FET channel is via only 19% heat flow from the device to the $SiO_2$ layer and into the substrate. The remaining 25% flows out through the gate and 56% flows out through the metal interconnects. Therefore, the penalty using conventional SOI is an increased device operating temperature (120-300 deg C.). Furthermore, thermal conductivity of SiGe is 15 times less than Si. Therefore, increased device temperature negatively affects performance of both strained Si/SiGe FETs and SiGe HBTs and is increased further in SOI structures. The mobility of electrons and holes are further degraded with increasing temperature. Therefore, local self-heating in SOI and GOI can be a concern for devices that are used in the on-state most of the time or for circuits with a high duty cycle. Scaling the Si film thickness degrades the thermal conductivity and increases the thermal resistance, with thin Si and thick BOX as the worst case.

A simple counter measure is to scale down the BOX thickness. A factor of 3 improvement in thermal conductance can be achieved by reducing the BOX thickness from 150 nm to 20 nm. Another approach is to introduce a high thermal conductivity material as the buried dielectric. There are several options but silicon nitride appears to be the most attractive one. It is an industrially mature material, it exhibits an order of magnitude higher thermal conductivity than $SiO_2$ and it is a well characterized insulator. It has been shown that a composite nitride/oxide buried dielectric is a viable approach for an improved thermal conductivity substrate.

Alternatively, the present invention teaches the use of rare-earth oxynitride composition for use as high thermal conductivity BOX layer.

GOI MOSFETs potentially may suffer from lower thermal conductivity of Ge relative to Si (Ge is 40% less than Si). Coupled to a thick $SiO_2$ BOX, thermal management of GOI will be an issue. For the case of thin Ge films, recent calculations suggest that thin Ge films take a lower thermal conductivity penalty than thin Si films. A higher thermal conductivity BOX for GOI would obviously prove beneficial.

Issues for EPI-SOI™

The desirability of ultrathin Si layers on insulator is presently hampered by layer non-uniformity and cost. The thermal conductivity of the BOX is becoming problematic in SOI due to the large thermal resistance of the BOX layer. The simple scaling of the silicon active layer thickness of FD-SOI has also been shown to breakdown due to short channel effects. A necessary step for mitigating the SCEs in FD-SOI is a scaling of the BOX from thick to thin layer dimensions, potentially as thin as 10 nm. The effect of such a thin BOX does increase capacitance in single gate planar MOSFETs via the channel to BOX coupling. However, the net benefit of reduced SCEs, better thermal management, the use of grounded planes or high resistivity beneath the BOX, and decreased mobility degradation more than compensate. The disclosed process known as Silicon-on-nothing further establishes the primary requirement in nanometer FD-SOI MOSFETs for continued performance.

The present invention teaches that using single crystal rare-earth oxides and oxy-nitrides is extremely useful for generating epitaxially grown FD-SOI structures. FIGS. 26 and 27 show RHEED patterns of both the rare-earth oxide layer and the Si active layer generating a fully epitaxial and fully depleted epi-SOI structure. Thick or thin Si and insulating rare-earth oxides and oxy-nitrides and/or oxy-phosphides can be grown. The layers are atomically flat and the Si/oxide interface is of gate oxide structural quality. The epitaxial technique can be used to either generate full wafer FD-SOI structures, or selective area growth. Therefore, a planar single or double gate MOSFET structure as described in essence by the complex SON process, would be trivial using the rare-earth oxide/Si epitaxial method; for instance see FIG. 28 which shows schematically epitaxial planar double gate FD-SOI structure using rare-earth gate oxides. An advantage of such an epitaxial deposition approach toward realizing SOI structures is that the technique is well suited toward FD-SOI layer thickness and has the uniformity and thickness control afforded by a layer-by-layer epitaxial method.

A possible hurdle to overcome for planar single gate MOSFET using epi-SOI technique is the fact that rare-earth oxides exhibit relatively large dielectric constants, $\kappa \sim 15$, compared to $SiO_2$. The ratio $\kappa(ErOx)/\kappa(SiO_2) \sim 3.8$-5.1, compared to $\kappa(Si_3N_4)/\kappa(SiO_2) \sim 1.9$. Comparing conventional SOI to epi-SOI by requiring the same dielectric coupling of a single gate FD-SOI MOSFET with 10 nm $SiO_2$ BOX with that of an ErOx BOX, the high-k insulator thickness needs to be 38-51 nm in thickness. ErOx layers as thick as several 100 nm are possible. Therefore, such a design constraint does not pose a problem. Conversely, the very fact that the BOX is high-$\kappa$ allows the ideal construct of a planar double gate MOSFET with ideal body factor n=1.0.

Realistically, for FD-SOI at 45 nm and beyond, the gate oxide thickness will be $t_{GOX}$=1-2 nm and have a high-k dielectric constant of $\kappa_G(HfO_2) \sim 22$. If a high-k BOX layer using ErOx is used with $\kappa_{BOX}(ErOx) \sim 15$ (refer Table I), then the body factor for a symmetric planar single gate FD-SOI MOSFET can be estimated as $n=1+(\kappa_G \cdot t_{BOX})/(\kappa_{BOX} \cdot t_{GOX})$.

For $t_{GOX}$=1 nm, the body factor for BOX thickness in the range $t_{BOX}$=10-100 nm, changes by n=1.0682-1.00682, respectively. Comparing with a conventional $SiO_2$ BOX with $k(SiO_2)$=3.9 and $t_{BOX}$=10-100 nm, the body factor varies as n=1.0178-1.00178. Clearly, the body factor increase due to a high-k BOX is not an issue. Also, mentioned previously, a thin high-k BOX is further advantageous for reducing SCEs.

The scaling of the BOX is ultimately in the range $18 \leq t_{BOX} \leq 44$ nm in the near term and $8 \leq t_{BOX} \leq 28$ nm in the longer term. The fact that these regions are red, indicates neither wafer bond/Smart-Cut nor SIMOX approaches are feasible at present. An ultra-thin BOX increases capacitance coupling between source, drain and channel with the conducting substrate compared to thick BOX planar single gate MOSFETs. This has the potential of reducing speed but drastically improving the electrostatic integrity (EI) of the device. The speed can be traded off against improved EI by reducing the channel doping, that eventually leads to improved speed for constant $I_{off}$.

An added benefit of RE-Ox BOX layers is the higher thermal conductivity relative to $SiO_2$. The heavy rare-earth metal oxide exhibits considerably higher thermal conductivity and is therefore beneficial in reducing self-heating effects.

When a lower dielectric constant BOX layer is desired and $SiO_2$ interfacial layers required (for increasing the effective band gap of the BOX), an epitaxial structure as shown in FIGS. 29a, b and c show a possible embodiment. The concept of introducing an oxygen excess during deposition of the single crystal REOx layer allows a concentration of oxygen to exist within the oxide structure as a function of growth direction. The oxygen excess contained within the $REO_X$ lattice is maintained such that subsequent Si epitaxy is not affected; single crystal Si can be deposited upon an $REO_X$ insulator layer with the same crystal orientation as the underlying Si substrate. A post deposition anneal is used to force an interfacial reaction between the oxygen excess and the Si atoms at the interface, thereby consuming any excess mobile anions and producing an SiO$_2$ interfacial layer. The interfacial SiO$_2$ layer is self terminated and the thickness is determined by the oxygen excess. This technique allows the single crystal Si cap layer to remain structurally perfect. The effective dielectric constant of a composite BOX layer is now determined by the ratio of the thickness of REOx relative to SiO$_2$. Note, the converse process of depositing Si on an amorphous SiO$_2$ layer results in amorphous Si.

An interesting situation arises for FD-SOI transition to FD-GOI MOSFETs. The replacement of SiO$_2$ (κ=3.9) by HfO$_2$ (κ~22), has shown that electric field fringing effects between the gate and source/drain are problematic for Si channels (κ(Si)=11.7). Introducing GOI, means the Ge channel layer has a ~38% higher dielectric constant relative to Si. If the dielectric constant mismatch between the gate-oxide material and the channel is defined as $\Delta\kappa=(\kappa_{GOX}-\kappa_{CH})/\kappa_{CH}$, then the dielectric constant mismatch between the gate oxide and the channel layer is potentially lower for Ge (Δκ=36%) relative to Si (Δκ=88%).

The epitaxial growth of single crystal Germanium on various rare-earth oxides and oxynitrides is also possible via the present invention. FIGS. 30 *a* and *b* show HR-TEM of single crystal ErO$_x$N$_y$ insulating layer deposited with zero defect density on Si(001) (a) and (b) Ge(001) surfaces. Furthermore, rare-earth oxides and or oxy-nitrides have been shown to deposit epitaxially on both Ge(111) and Ge(100) surfaces. Clearly, the opportunity exists for an elegant epitaxial method for the realization of GOI on (100) and (111) oriented Si substrates. The advantage is that high quality commercial Si substrates need only be used.

For completeness, a general observation can be made for FD-SOI regarding interface scattering that adversely affects the mobility, in particular the hole. Referring to a fully depleted MOSFET with a metal gate stack, two regimes are examined, the thin and thick BOX configuration, keeping all other layers constant. For ultra thin channel layers, quantization effects become important. The carrier localization with thick BOX is skewed toward the high-k gate oxide and therefore will be more susceptible to interface scatter and therefore mobility degradation. For the case of the thin BOX, the effective carrier wavefunction in the vertical, is delocalized and penetrates significantly into the substrate. The thin BOX situation potentially allows the FD MOSFET design to be made less susceptible to interface scattering, which is advantageous.

In some embodiments a gate oxide for Ge MOS is single crystal rare-earth oxynitrides epitaxially deposited on Ge (001) and Si(001) oriented surfaces. By introducing nitrogen into the binary oxide, oxygen vacancies can be modified and the lattice constant tuned for pseudomorphic growth. Alternatively, other rare-earth compositions are employed.

Generating a gate stack consisting of a single crystal gate oxide followed by a single crystal Si and or Ge gate electrode offers several advantages. The diffusivity of impurity dopants in the gate electrode is substantially less in single crystal semiconductors compared to amorphous and or poly-crystalline materials. Gate depletion effects may be superior using narrow band gap gate electrode, such as Ge. Conversely, the gate depletion effect may be worsened—therefore further work is required to understand the pro's and con's of such an approach.

FIG. 31: Novel gate stack structure for Si nMOS and pMOS devices using single crystal gate oxide and single crystal Si gate electrode. Optionally, germanium and/or germanium-silicon alloys may be used.

FIG. 32: Novel gate stack structure for Si channel nMOS and pMOS devices using single crystal gate oxide and single crystal Ge gate electrode. Optionally, germanium and/or germanium-silicon alloys may be used.

FIG. 33 shows an example of a high electron mobility transistor based of Si/ErOx heterostructure with localized dopant sheet in the ErOx barrier. Optionally, germanium and/or germanium-silicon alloys may be used.

Figure 34A:
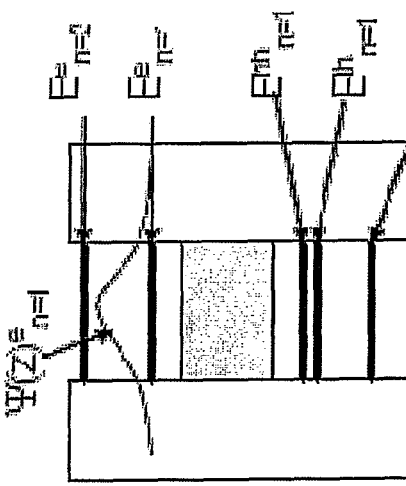
FIG. 34 depicts energy diagrams and band structures for thick channel SOI, FIG. 34*a* with corresponding band structure, FIG. 34*b*; thin channel SOI, FIG. 34*c* with corresponding band structure, FIG. 34*d*. Note the separation of the hh band, 3401, and the lh band, 3405, occurring in the thin channel structure, 3410 and 3415.
Figure 34B:
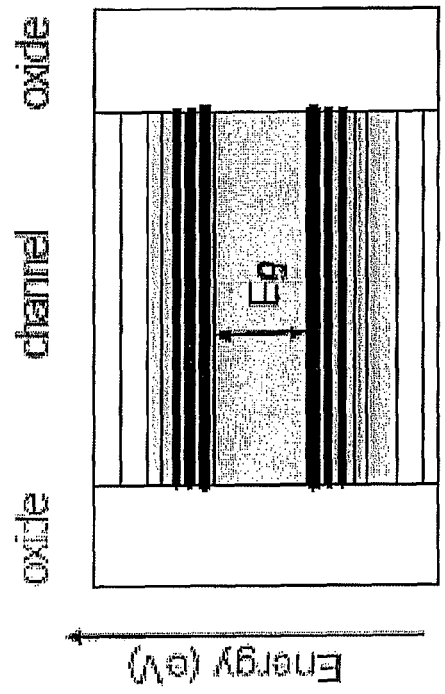
Figure 34C:
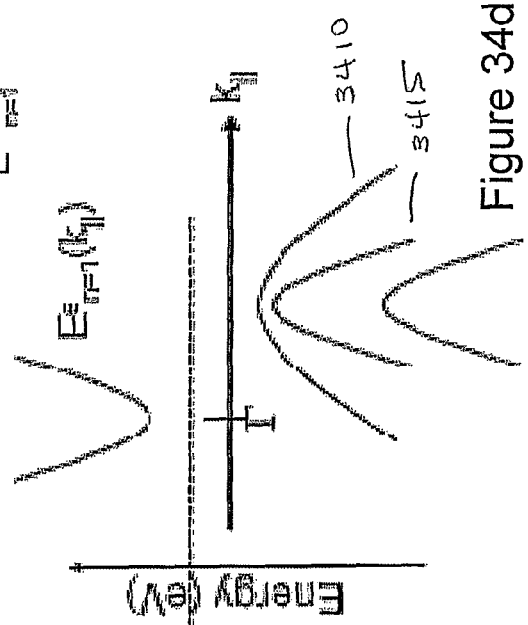
Figure 34D:
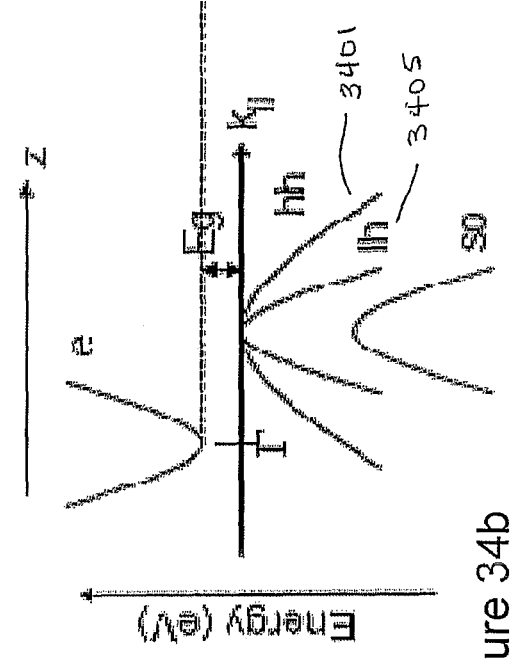

By adequate nitrogen profile tuning, a GOI structure can be epitaxially deposited on a Si substrate. The method can be grown with very low channel doping. Coupled with thin BOX designs, GOI addresses I$_{off}$ and mobility concerns for FD-GOI devices.

Diamond as a semiconductor material has not been commercially exploited to date. Based on epitaxial techniques discussed above one embodiment of a semiconductor structure comprises a substrate, one or more single crystal layers comprising silicon, germanium, silicon-germanium mixtures, one or more single crystal layers comprising one ore more rare-earth ions, and optionally, one or more single crystal diamond layers. Alternatively, high k dielectrics, silicon oxide, silicon oxy-nitride, silicon nitride and alumina layers may comprise a portion of a structure; alternatively, piezoelectric layers may comprise a portion of a structure. Piezoelectric may be comprised, optionally, of rare-earth ions, mixtures of lead-zirconium-titanate, barium-strontium-titanate, other titanate mixtures or mixtures thereof as well as other mixtures known to one knowledgeable in the art.

In some embodiments a solid state device comprises a structure comprising a first region substantially single crystal of first crystallographic orientation and first composition; a second region substantially single crystal of second crystallographic orientation and second composition; and a third region substantially single crystal of third crystallographic orientation and third composition separated from the first region by the second region; wherein the second region comprises at least one rare-earth metal compound such that the third region is of a measurable different orientation than the first region; for instance, optionally, (111) or (100) or (110) and within ±10° of the chosen orientation for the first region and something different than the chosen orientation for the second region. In some embodiments a solid state device of the instant invention has a composition of the first and third regions comprising at least one group IV element; for instance, optionally, carbon or silicon or germanium or silicon carbide or silicon-germanium. In some embodiments a solid state device of the instant invention has a composition of the first region comprising an aluminum-oxygen compound such as sapphire. In some embodiments a solid state device of the instant invention has a composition of the third region comprising at least one group III and at least one group V compound; for instance, optionally gallium nitride or aluminum nitride. In some embodiments a solid state device of the instant invention has a structure wherein a first region is silicon or sapphire, a second region is a rare-earth compound and the third region is gallium nitride. In some embodiments a solid state device of the instant invention has a composition of the third region comprising at least one group II and at least one group VI compound. A key and novel concept of the instant invention is that by interposing a rare-earth compound between a substrate and a third layer the orientation of a third layer may be a measurable amount different than the original substrate or first region.

The present invention further teaches a class of rare-earth materials suitable for single crystal dielectrics and/or conductors; specifically, the materials of rare-earth metal oxide ($REO_x$), rare-earth metal nitride, rare-earth metal phosphide, rare-earth metal oxynitride ($REO_xN_y$) and rare-earth metal oxy-phosphide ($REO_xP_y$) glasses and or crystalline material and mixtures thereof; in some embodiments as many as three different rare-earths may be present; varying proportions of O, N and P may be present; and combinations of C, Si, Ge and Si—Ge mixtures may be present; a generalized formula representing the class is $[Z]_u[RE1]_v[RE2]_w[RE3]_x[J1]_y[J2]_z$ wherein [RE] is chosen from a group comprising the lanthanide series plus yttrium; [Z] is chosen from a group comprising carbon, silicon, germanium and SiGe mixtures, [J1] and [J2] are chosen from a group comprising Oxygen (O), Nitrogen (N), and Phosphorus (P), and $0 \leq u, v, w, z \leq 5$, and $0 < x, y \leq 5$. A rare-earth metal is chosen from the group commonly known in the periodic table of elements as the lanthanide series or Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb) and Luthium (Lu) and additionally Yttrium.

In some embodiments an epi-Twist construct is applied to substrates of a hexagonal orientation such as sapphire or III-V compounds such as of the GaAs or GaN families to enable a non-hexagonal epitaxial growth, for instance of silicon or other group IV material. Alternatively, a rare-earth epi-twist layer enables growth of a hexagonal layer of different orientation than a hexagonal substrate. In some embodiments a substrate of cubic orientation is utilized in combination with an appropriate rare-earth compound to enable growth of a hexagonal or tetragonal compound; for example gallium nitride on a rare-earth epi-twist layer on a silicon substrate or layer.

In some embodiments a solid state device comprises a structure comprising a first region substantially single crystal of first crystallographic orientation and first composition; a second region substantially single crystal of second crystallographic orientation and second composition; and a third region substantially single crystal of third crystallographic orientation and third composition separated from the first region by the second region; wherein the second region comprises at least one rare-earth metal compound such that the third crystallographic orientation is a hexagonal type and the first crystallographic orientation is a cubic type. Optionally, the composition of the second region is chosen from a composition described by $[Z]_u[RE1]_v[RE2]_w[RE3]_x[J1]_y[J2]_z$ wherein [RE] is chosen from a group comprising the lanthanide series plus yttrium; [Z] is chosen from a group comprising carbon, silicon, germanium and SiGe mixtures, [J1] and [J2] are chosen from a group comprising Oxygen (O), Nitrogen (N), and Phosphorus (P), and $0 \leq u, v, w, z \leq 5$, and $0 < x, y \leq 5$. Optionally, the composition of the first region comprises at least one group IV element. Optionally, the composition of the third region is chosen from a group comprising $Al_2O_3$, a group III-V compound or a group II-VI compound. Optionally, the first crystallographic orientation is chosen from a group comprising (111), (100) and (110) and is within ±5° of the chosen orientation. Optionally, the third crystallographic orientation is chosen from a group comprising (1111), (0001), (11-20), (1-100), (1-210) and (10-10) and is within ±10° of the chosen orientation and is different from the first crystallographic orientation.

In some embodiments a rare-earth layer functions as a gate oxide replacement; in some embodiments two or more rare-earth layers function as a dual gate structure with intervening active semiconductor layers.

In some embodiments a solid state device comprises a structure comprising; a first region substantially single crystal of first crystallographic orientation and first composition; a second region substantially single crystal of second crystallographic orientation and second composition; and a third region substantially single crystal of third crystallographic orientation and third composition separated from the first region by the second region; wherein the second region comprises at least one rare-earth metal compound such that the third crystallographic orientation is a tetragonal type and the first crystallographic orientation is a cubic type. Optionally, the first composition is chosen from a group comprising Si, Ge, C, ternary alloys of silicon-germanium-carbon and rare-earth carbides, [REC]. Optionally, the third composition is chosen from a group comprising group IV elements and ternary alloys of silicon-germanium-carbon and rare-earth carbides, [REC].

In some embodiments a solid state device comprises a structure comprising; a first region substantially single crystal of first crystallographic orientation and first composition; a second region substantially single crystal of second crystallographic orientation and second composition; and a third region substantially single crystal of third crystallographic orientation and third composition separated from the first region by the second region; wherein the second region comprises at least one rare-earth metal compound such that the third crystallographic orientation is a wurtzite type and the first crystallographic orientation is a cubic type. Optionally, the first composition is chosen from a group comprising group IV elements and ternary alloys of silicon-germanium-carbon and rare-earth carbides, [REC]. Optionally, the third composition is chosen from a group comprising group II-VI elements, including zinc oxide (ZnO), zinc-oxynitride (ZnON), zinc-magnesium-oxide (ZnMgO) and III-V elements, including gallium nitride (GaN), and aluminum nitride (AlN).

In some embodiments a solid state device comprises a structure comprising a first region substantially single crystal of first crystallographic orientation and first composition; a second region substantially single crystal of second crystallographic orientation and second composition; and a third region substantially single crystal of third crystallographic orientation and third composition separated from the first region by the second region; wherein the second region comprises at least one rare-earth metal compound such that the third crystallographic orientation is a hexagonal type and the first crystallographic orientation is a zinc-blende type. Optionally, the third composition is chosen from a group comprising Si(111), Ge(111), c-axis GaN and c-axis ZnO. Optionally, the first composition is chosen from a group comprising gallium arsenide (GaAs), indium phosphide (InP), indium arsenide (InAs), cadmium telluride (CdTe), zinc telluride (ZnTe), indium-gallium-arsenide-nitride (InGaAsN), indium antimonide (InSb), and alloys thereof.

In some embodiments of a solid state device comprising more than one layer a rare-earth layer enables a structure or orientation change by inducing strain in the various layers. In one example, ZnO is typically wurtzite or hexagonal. Under high pressure it transforms to rock-salt or cubic structure. This occurs when ZnO is deposited upon a Si(111)/REOx/ structure; a first layer is Si (111); a second layer is REOx in a bibyite structure. A strained thin film ZnO is grown epitaxially below the critical thickness limit such that highly strained and low defect ZnO is deposited as layer or region three. The high strain causes the ZnO rock salt phase to be favored. In an optional embodiment a strained structure is grown with alternating layers of a rare-earth compound and a semiconductor compound; for example Si/REOx/ZnO/REOx/ZnO/, with Si initially, followed by a multi-layer structure of REOx/ZnO, optionally as a superlattice.

As used herein a solid state device is chosen from a group comprising field effect transistors, multiple gate field effect transistors, vertical gate field effect transistors, electronic memories, magnetic sensors and storage, semiconductor optical amplifiers, semiconductor photo-detectors, semiconductor lasers, bipolar transistors, CMOS devices, light emitting devices, solar cell and/or photo-voltaic devices and thermoelectric devices. Combinations of the above in an integrated circuit type device are included.

The foregoing described embodiments of the invention are provided as illustrations and descriptions. They are not intended to limit the invention to a precise form as described. In particular, it is contemplated that functional implementation of invention described herein may be implemented equivalently in various combinations of processes and structures and/or other available functional components or building blocks. Other variations and embodiments are possible in light of above teachings to one knowledgeable in the art, and it is thus intended that the scope of invention not be limited by this Detailed Description, but rather by Claims following.

I claim:

1. A solid state device comprising a structure comprising;
   a first region substantially single crystal of first crystallographic orientation and first composition;
   a second region substantially single crystal of second crystallographic orientation and second composition; and
   a third region substantially single crystal of third crystallographic orientation and third composition separated from the first region by the second region; wherein the second region is in contact with the first and third regions and comprises at least one rare-earth metal compound such that the third crystallographic orientation is different from the first crystallographic orientation and wherein the first and third compositions consist of group IV elements and the second composition is described by $[RE1]_v[RE2]_w[RE3]_x[J1]_y[J2]_z$ wherein [RE] is chosen from a group consisting of the lanthanide series plus yttrium; [J1] and [J2] are chosen from a group consisting of Oxygen (O) and Phosphorus (P), and $0 \leq v, w, z \leq 5$, and $0 < x, y \leq 5$ such that the lattice spacing of the second composition introduces predetermined strain into the first and third regions.

2. A solid state device of claim 1 wherein said solid state device comprises at least one device chosen from a group consisting of field effect transistors, multiple gate field effect transistors, vertical gate field effect transistors, electronic memories, magnetic sensors and storage, semiconductor optical amplifiers, semiconductor photo-detectors, semiconductor lasers, bipolar transistors, CMOS devices, light emitting devices, solar cells, photo-voltaic devices and thermoelectric devices.

3. A solid state device comprising a structure comprising;
   a first region substantially single crystal of first crystallographic orientation and first composition;
   a second region substantially single crystal of second crystallographic orientation and second composition; and
   a third region substantially single crystal of third crystallographic orientation and third composition separated from the first region by the second region; wherein the second region is in contact with the first and third regions and comprises a rare-earth metal compound such that the third crystallographic orientation is different from the first crystallographic orientation and wherein the first and third compositions are not the same and consist of group IV elements and the second composition is described by $[RE1]_v[RE2]_w[RE3]_x[J1]_y[J2]_z$ wherein [RE] is chosen from a group consisting of the lanthanide series plus yttrium; [J1] and [J2] are chosen from a group consisting of Oxygen (O), Nitrogen (N) and Phosphorus (P), and $0 \leq v \leq 5$, and $0 < w, x, y, z \leq 5$ such that the second region introduces a predetermined strain into the first and third regions and the strain in the first region is different from the strain in the third region.

4. The solid state device of claim 3 wherein the composition of the second region proximate the first region is different from the composition of the second region proximate the third region.

5. A solid state device comprising a structure comprising;
   a first region substantially single crystal of first crystallographic orientation and first composition;
   a second region substantially single crystal of second crystallographic orientation and second composition; and
   a third region substantially single crystal of third crystallographic orientation and third composition separated from the first region by the second region; wherein the second region is in contact with the first and third regions and comprises a rare-earth metal compound such that the third crystallographic orientation is different from the first crystallographic orientation and wherein the first composition consist of group IV elements and the third composition consist of group III elements and group V elements and the second composition is described by $[RE1]_v[RE2]_w[RE3]_x[J1]_y[J2]_z$ wherein [RE] is chosen from a group consisting of the lanthanide series plus yttrium; rill and [J2] are chosen from a group consisting of Oxygen (O), Nitrogen (N) and Phosphorus (P), and $0 \leq v \leq 5$, and $0 < w, x, y, z \leq 5$ such that the second region introduces a predetermined strain into the first and third regions and the strain in the first region is different from the strain in the third region; wherein the composition of the second region proximate the first region is different from the composition of the second region proximate the third region.

\* \* \* \* \*